US009584906B2

(12) United States Patent
Takahashi et al.

(10) Patent No.: US 9,584,906 B2
(45) Date of Patent: Feb. 28, 2017

(54) MIXING DEVICE, MIXING SIGNAL PROCESSING DEVICE, MIXING PROGRAM AND MIXING METHOD

(75) Inventors: Kota Takahashi, Tokyo (JP); Wataru Owaki, Tokyo (JP)

(73) Assignee: The University of Electro-Communications, Tokyo (JP)

(*) Notice: Subject to any disclaimer, the term of this patent is extended or adjusted under 35 U.S.C. 154(b) by 309 days.

(21) Appl. No.: 14/342,064

(22) PCT Filed: Aug. 31, 2012

(86) PCT No.: PCT/JP2012/072171
§ 371 (c)(1),
(2), (4) Date: Feb. 28, 2014

(87) PCT Pub. No.: WO2013/031953
PCT Pub. Date: Mar. 7, 2013

(65) Prior Publication Data
US 2014/0219478 A1    Aug. 7, 2014

(30) Foreign Application Priority Data

Aug. 31, 2011  (JP) ................................ 2011-189187

(51) Int. Cl.
*H04B 1/00* (2006.01)
*H04R 3/00* (2006.01)
(Continued)

(52) U.S. Cl.
CPC .............. *H04R 3/00* (2013.01); *H04S 1/007* (2013.01); *H03G 3/20* (2013.01); *H04R 25/43* (2013.01);
(Continued)

(58) Field of Classification Search
CPC ...... H04R 3/00; H04R 2420/01; H04R 25/43; H04S 1/007; H04S 2400/09; G10L 21/02;
(Continued)

(56) References Cited

U.S. PATENT DOCUMENTS 5,228,093 A * 7/1993 Agnello ................. H04H 60/04
381/103
5,664,051 A * 9/1997 Hardwick ............... G10L 19/02
704/205

(Continued)

FOREIGN PATENT DOCUMENTS

JP          60091227     *  5/1985  ............... G10L 9/00
JP        2005-326587 A    11/2005
(Continued)

OTHER PUBLICATIONS

Wavesfactory, Trackspacer User Manual, 2012, Wavesfactory, All.*
(Continued)

*Primary Examiner* — Vivian Chin
*Assistant Examiner* — Ubachukwu Odunukwe
(74) *Attorney, Agent, or Firm* — Osha Liang LLP

(57) ABSTRACT

A mixing device includes a signal data generation unit that generates signal data on a time-frequency plane composed of a time-axis and a frequency-axis from each of two or more input signals derived from a time domain, a signal processing unit that receives the signal data for the two or more input signals, and performs a mixing process that includes an adding operation of the signal data for each corresponding point on the time-frequency plane of the signal data for each of the input signals, and an output signal generation unit that receives the operation result of the signal processing unit and outputs an output signal formed by converting the inputted signal into a signal of a predetermined format.

19 Claims, 15 Drawing Sheets

(51) Int. Cl.
*H04S 1/00* (2006.01)
*H03G 3/20* (2006.01)
*H04R 25/00* (2006.01)

(52) U.S. Cl.
CPC ...... *H04R 2420/01* (2013.01); *H04S 2400/09* (2013.01)

(58) Field of Classification Search
CPC . G10L 21/0332; G10L 19/00; G10K 21/0364; G10K 11/175; H03G 3/32; H03G 5/025; H03G 5/00; H03G 3/20
USPC .. 381/1, 119, 17, 99, 94.3, 80, 317, 98, 103, 381/28, 57, 73.1, 94.7, 110, 104; 704/212, 243, 226, 500, 207, 236, 233; 84/635, 625; 700/94; 327/233, 334
See application file for complete search history.

(56) References Cited

U.S. PATENT DOCUMENTS

| | | | |
|---|---|---|---|
| 7,269,550 B2* | 9/2007 | Tsushima | G10L 19/0212 704/205 |
| 2003/0221542 A1* | 12/2003 | Kenmochi | G10H 7/002 84/616 |
| 2006/0064299 A1* | 3/2006 | Uhle | G06K 9/6242 704/212 |
| 2008/0049943 A1* | 2/2008 | Faller | G10L 19/008 381/17 |
| 2010/0079185 A1* | 4/2010 | Lee | G10L 19/008 327/233 |
| 2011/0058685 A1* | 3/2011 | Sagayama | G10L 21/0272 381/98 |

FOREIGN PATENT DOCUMENTS

| | | |
|---|---|---|
| JP | 2007-019980 A | 1/2007 |
| JP | 2010-204533 A | 9/2010 |
| JP | 2011-501486 A | 1/2011 |
| WO | 2005/112002 A1 | 11/2005 |

OTHER PUBLICATIONS

International Search Report issued in PCT/JP2012/072171 mailed on Oct. 30, 2012 (4 pages).
International Preliminary Report on Patentability from PCT/JP2012/072171 issued on Sep. 12, 2013 (15 pages).
Yamauchi, T.; "Mix Down Research Laboratory"; Sound & Recording Magazine, vol. 29, Mar. 2010, pp. 140-141 (1 page).
Izhaki R.; "Mixing Audio"; Elsevier, pp. 376-381 (3 pages).
International Preliminary Report on Patentability issued in corresponding International Application No. PCT/JP2012/072171, mailed Mar. 6, 2014 (5 pages).

* cited by examiner

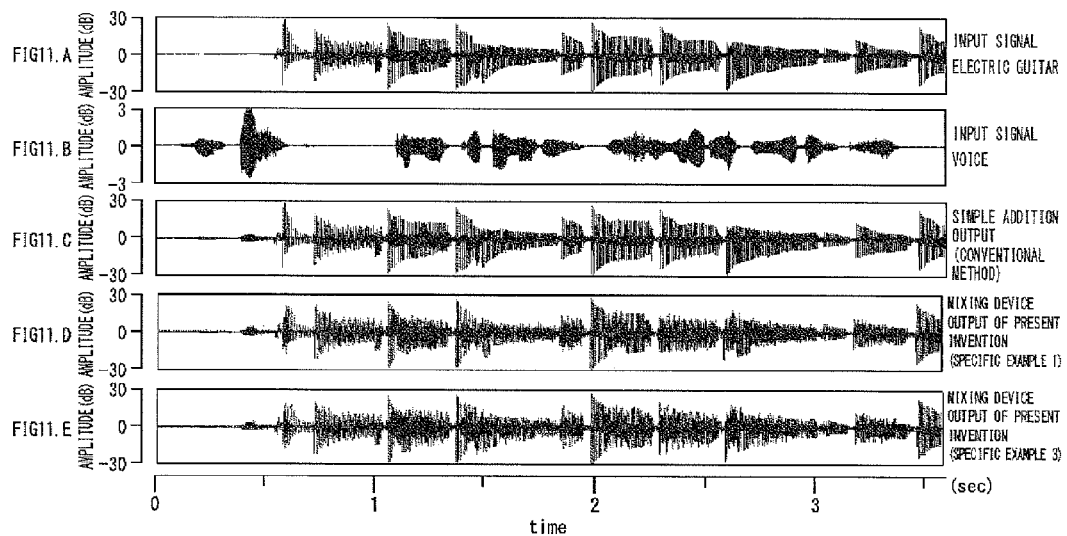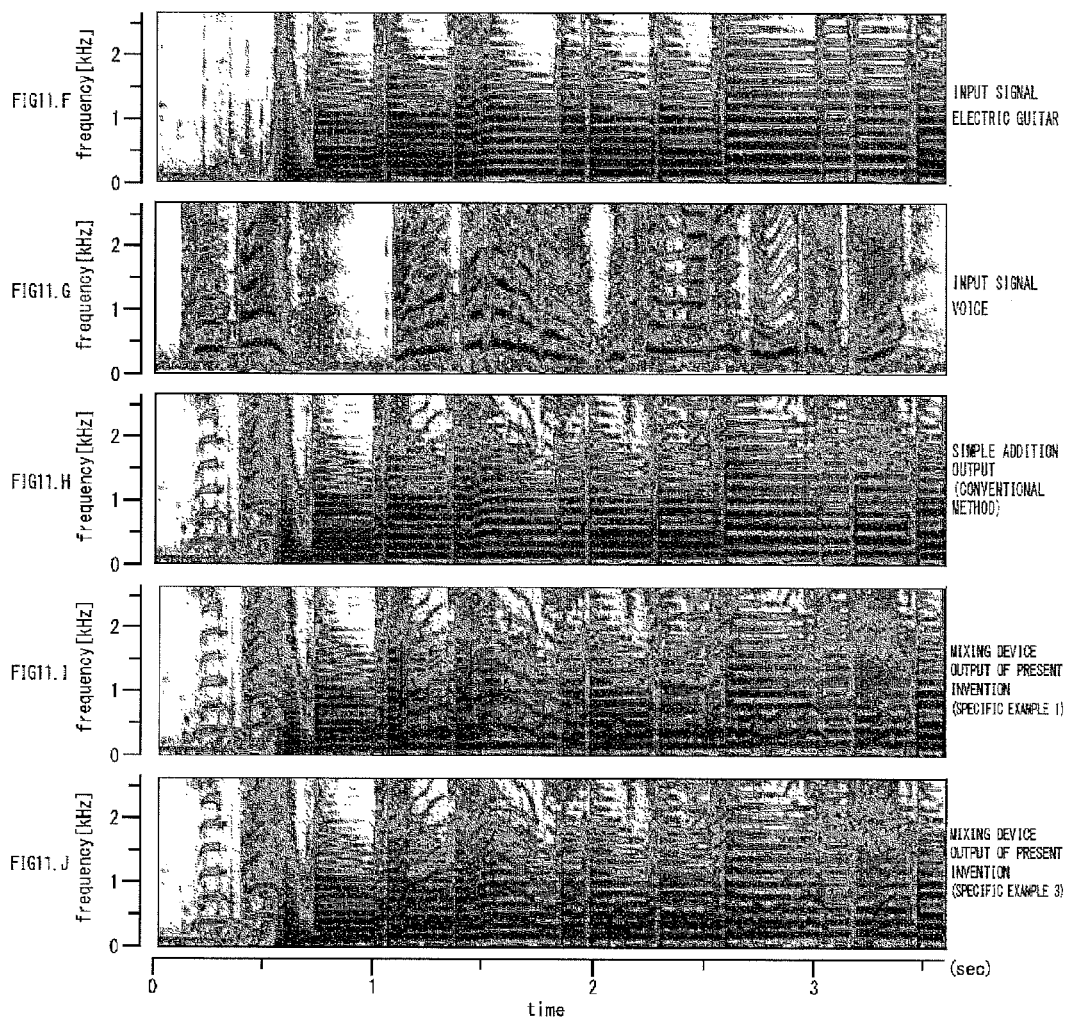

MIXING DEVICE, MIXING SIGNAL PROCESSING DEVICE, MIXING PROGRAM AND MIXING METHOD

FIELD OF THE INVENTION

This invention relates to a mixing device which mixes two or more input signals with one another and outputs a mixing signal.

The present application asserts priority rights based on JP Patent Application 2011-189187 filed in Japan on Aug. 31, 2011. The total contents of disclosure of the patent application of the senior filing date are to be incorporated by reference into the present application.

BACKGROUND OF THE INVENTION

Conventionally-used mixers including from a mixing console for use in a studio and to a mixer for amateurs are provided with basic operations for carrying out a mixing process by computing a weighted sum of respective input voice signals. In the case when the weighted sum is insufficient, an effects unit is coupled to an input and/or an output of the mixer so that by adding a linear or non-linear operation process thereto, target sound quality and sound field feeling can be realized. Upon mixing a musical instrument sound A with a voice B, in order to allow the voice B to be clearly heard even after the mixing process, the following methods are proposed.

A first method is to use a linear filter. More specifically, by using an equalizer that is one type of effects unit, a filtering process is carried out on an essential frequency band of the voice B so as to attenuate the same frequency band as that of the musical instrument sound A so that the hearing of the voice B is prevented from being interrupted by the musical instrument sound A. Non-Patent Document 1 has disclosed a method by which, with respect to a mixing process of a base guitar and a bass drum, a band in the vicinity of 200 Hz of the frequency band of a sound of the bass drum is attenuated so as to prevent the sound of the base guitar from being interrupted by the sound of the bass drum.

A second method is to use a processing system referred to as "ducker" described in Non-Patent Document 2. By using the ducker, for a time section in which the output level of a voice is kept at a fixed value or more, the musical instrument sound is attenuated by a fixed attenuation amount, and by overlapping the voice with the musical instrument sound after having been attenuated, these sound sources can be mixed with each other without the voice being interrupted by the musical instrument sound.

As another example similar to the second method, Patent Document 1 has described a technique relating to a sound calming process of audio sound source in which in the case when during reproduction of a music by a car stereo system, an attempt is made to make a voice from a navigation device more conspicuous only to the driver, the music that is being reproduced is subjected to a sound calming process and the navigation voice is mixed with the sound source subjected to the sound calming process.

Patent Document

PTL 1: Japanese Patent Application Laid-Open No. 2007-19980

Non-Patent Document

Non-Patent Document 1: Takayoshi Yamauchi, "Mix Down Research Laboratory", Sound & Recording Magazine, p 140 to 141, Vol. 29, March 2010.

Non-Patent Document 2: Roery khaki, "Mixing Audio", Elsevier 2008.

In the case of a method described in Non-Patent Document 1 in which the frequency band of a sound source signal is operated by using a linear filter, the sound of a base guitar in the vicinity of 200 Hz processed by an effects unit can be easily heard. However, in contrast, the sound of a bass drum whose frequency band in the vicinity of 200 Hz has been cut lacks energy in the vicinity of this frequency band during all the music performance time, resulting in a defect causing damages to the music itself.

In the case of a method described in Non-Patent Document 2 which carried out an operation in a time domain in which upon input of a sound source that is desirably made conspicuous, other sound sources are attenuated by using the ducker, instantaneously when a voice serving as the sound source to be desirably made conspicuous is inputted, the volume of a musical instrument forming the other sound source is lowered. For this reason, a listener who has paid attention to the musical instrument sound tends to feel stress.

In the case of an audio sound calming device described in Patent Document 1 as well, for the driver, it becomes difficult to listen to a music upon outputting a guiding voice of a navigation system, and the listener feels stress in the same manner as described above.

SUMMARY OF THE INVENTION

In one aspect, one or more embodiments of the present invention may provide a mixing device capable of providing a finely adjusted mixing process on both of time and frequency domains. Moreover, one or more embodiments of the present invention may provide a mixing device that increases the degree of clearness of a sound source to be listened to, without causing a large fluctuation in the volume of the inputted sound source in both of the time domain and frequency domain of a mixed signal, and allows a listener to recognize that an easy listening has been achieved. Additionally, in this case, the expression "to increase the degree of clearness of a sound source to be listened to" means that the listener is allowed to recognize that the degree of clearness of the sound source to be listened to has been improved in the signal after subjected to the mixing process.

In one aspect, a mixing device according to one or more embodiments of the present invention may comprise: a signal data generation unit which converts an input signal derived from each of two or more signals derived from a time domain into a signal in a frequency domain so that signal data on a time-frequency plane composed of a time axis and a frequency axis is generated; a signal processing unit which uses signal data derived from the two or more input signals as an input, and carries out a mixing process including an adding operation of signal data for respective points that are corresponding to each other on the time-frequency plane of the respective signal data of the input signals; and an output signal generation unit to which the operation result of the signal processing unit is inputted and from which an output signal formed by converting the inputted signal into a predetermined format is outputted.

In one or more embodiments, for example, the signal processing unit comprises a signal characteristic judgment unit that: uses at least signal data of a point that is different from the corresponding point of at least one of the input signals, has a predetermined relationship with the corresponding point on the time-frequency plane, and determines a signal characteristic at the corresponding point of the signal data of the at least one of the signals, wherein the adding operation is carried out in accordance with the determined signal characteristic.

In another aspect, a mixing device according to one or more embodiments of the present invention may comprise: a signal data input unit which receives an input of signal data on the time-frequency plane composed of the time-axis and frequency-axis, which is generated by respective two or more input signals derived from signals in the time domain; and a signal processing unit which uses signal data derived from the two or more input signals as an input, and carries out a mixing process including an adding operation of signal data for respective points that are corresponding to each other on the time-frequency plane of the respective signal data of the input signals; and a signal data output unit for outputting the operation result of the signal processing unit.

In another aspect, a mixing program according to one or more embodiments of the present invention may be a program to be executed by a computer. The mixing program may comprise: from respective two or more input signals derived from signals in a time domain, allowing a computer to generate signal data on a time-frequency plane composed of a time-axis and a frequency-axis; a step of: by using signal data derived from the two or more input signals as an input, allowing the computer to carry out a mixing process including an adding operation of signal data for respective points that are corresponding to each other on the time-frequency plane of the respective signal data of the input signals; and a step of: after inputting the result of the mixing process thereto, allowing the computer to convert the input signal into a signal having a predetermined format, and then output the resulting output signal.

In another aspect, a mixing method according to one or more embodiments of the present invention may comprise: by using a signal data generation unit, generating signal data on a time-frequency plane composed of a time-axis and a frequency-axis from respective two or more input signals derived from signals in a time domain; by using a signal processing unit, and by using signal data derived from the two or more input signals as an input, carrying out a mixing process including an adding operation of signal data for respective points that are corresponding to each other on the time-frequency plane of the respective signal data of the input signals; and after inputting the operation result of the signal processing unit thereto, by using an output signal generation unit, converting the input signal into a signal having a predetermined format in the time domain, and then outputting the resulting output signal.

In accordance with one or more embodiments, in the mixing signal processing device, the mixing program, or the mixing method, since a mixing process is carried out for respective points that are corresponding to each other on the time-frequency plane of the respective signal data of the input signals, it is possible to carry out a finely adjusted mixing process on both of the two directions of the time-axis and frequency-axis.

BRIEF DESCRIPTION OF DRAWINGS

FIGS. 11A to 11J show examples in which an output of the mixing device is outputted on a time axis as well as on a time-frequency plane (spectrogram) according to one or more embodiments of the present invention.

DETAILED DESCRIPTION OF THE INVENTION

Referring to Figures, the following description will discuss a mixing device, a mixing signal processing device, a mixing program and a mixing method to which the present invention is applied. In this case, the explanations will be given in the following order.
1. Mixing Device
(1) Configuration
(2) Operation Principle and Specific Example
(3) Another Specific Example
(4) Actual Measurement Example
2. Mixing Signal Processing Device
3. Mixing Program
4. Mixing Method
5. Others, Applications or the like

1. Mixing Device

(1) Configuration

Figure 1:
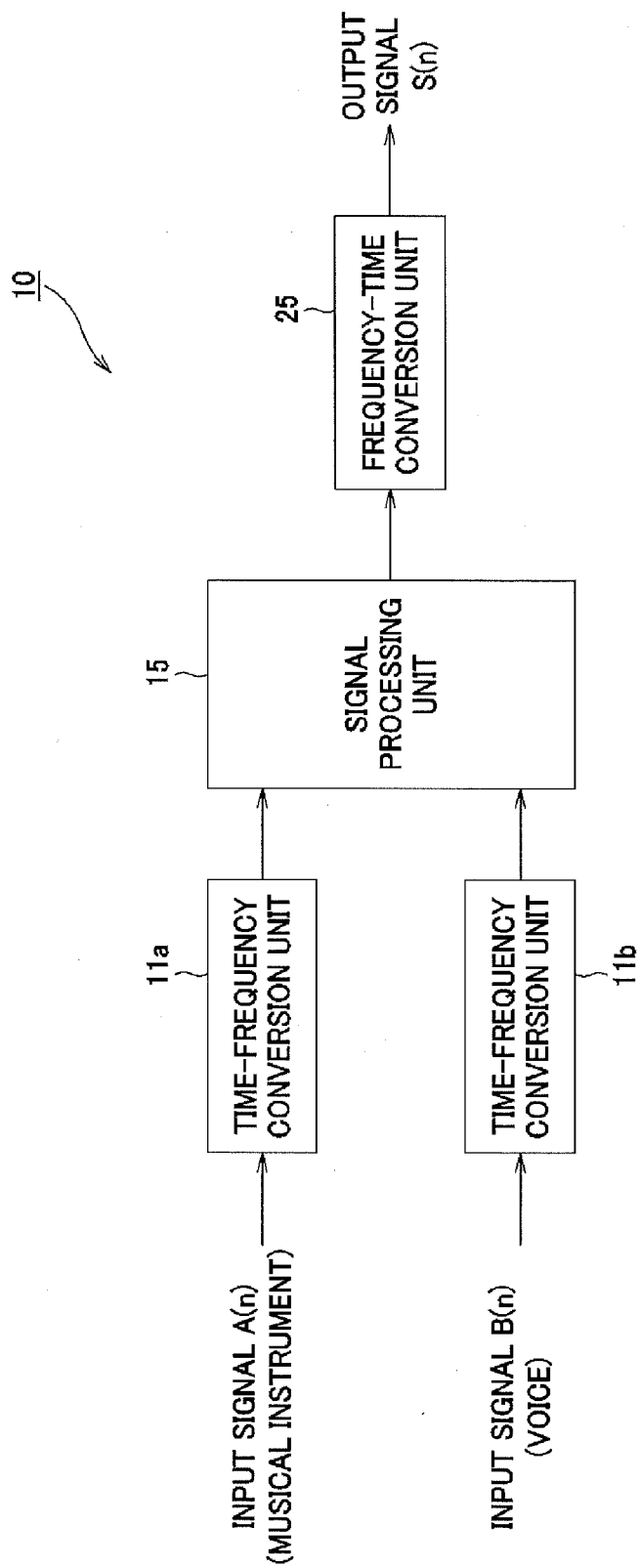
FIG. 1 is a block diagram showing a structural example of a mixing device of one or more embodiments of the present invention.

FIG. 1 is a drawing that shows a structural example of a mixing device (hereinafter, referred to also as a smart mixer). A mixing device 10 is provided with time-frequency conversion units 11a and 11b to which two input signals A(n) and B(n) in a time domain are respectively inputted and a signal processing unit 15 for carrying out a mixing process of signal data on a time-frequency plane. Moreover, the mixing device 10 is also provided with a frequency-time conversion unit 25 that converts a mixing signal generated in a frequency domain to an output signal S(n) in the time domain so as to output the output signal S(n). In this case, the time-frequency conversion units 11a and 11b correspond to one mode of a signal data generation unit of the present invention. Moreover, the frequency-time conversion unit 25 is one mode of an output signal generation unit of the present invention.

The input signals A(n) and B(n) are inputted to the time-frequency conversion units 11a and 11b and converted into signals in the frequency domain. In the time-frequency conversion units 11a and 11b, a short-time fast Fourier Transform (hereinafter, referred to also as "short-time FFT"), a short-time Fourier transform, a wavelet transform, a transform by a filter bank, or other known conversion methods, conversion circuits, or the like, to the time-frequency distribution are used. Not limited to an analog filter, the filter of the filter bank may be a digital filter. In the time-frequency conversion units 11a and 11b, methods for carrying out component decompositions including frequency information, such as generalized harmonic analyses, sinusoidal wave decomposition, sparse decomposition, or the like, may be used, or other conventionally known techniques or methods may be used.

Additionally, in FIG. 1, two input signals to be mixed are shown; however, not limited to two input signals, three or more of them may be used. In accordance with the number of the input signals, the required number of the time-frequency conversion units may be prepared, or by time-dividing a plurality input signals, the input signals may be processed by one time-frequency conversion unit. Moreover, for example, in the case when an input signal is dealt as packet data, the data can be processed by using one time-frequency conversion unit.

Figure 2:
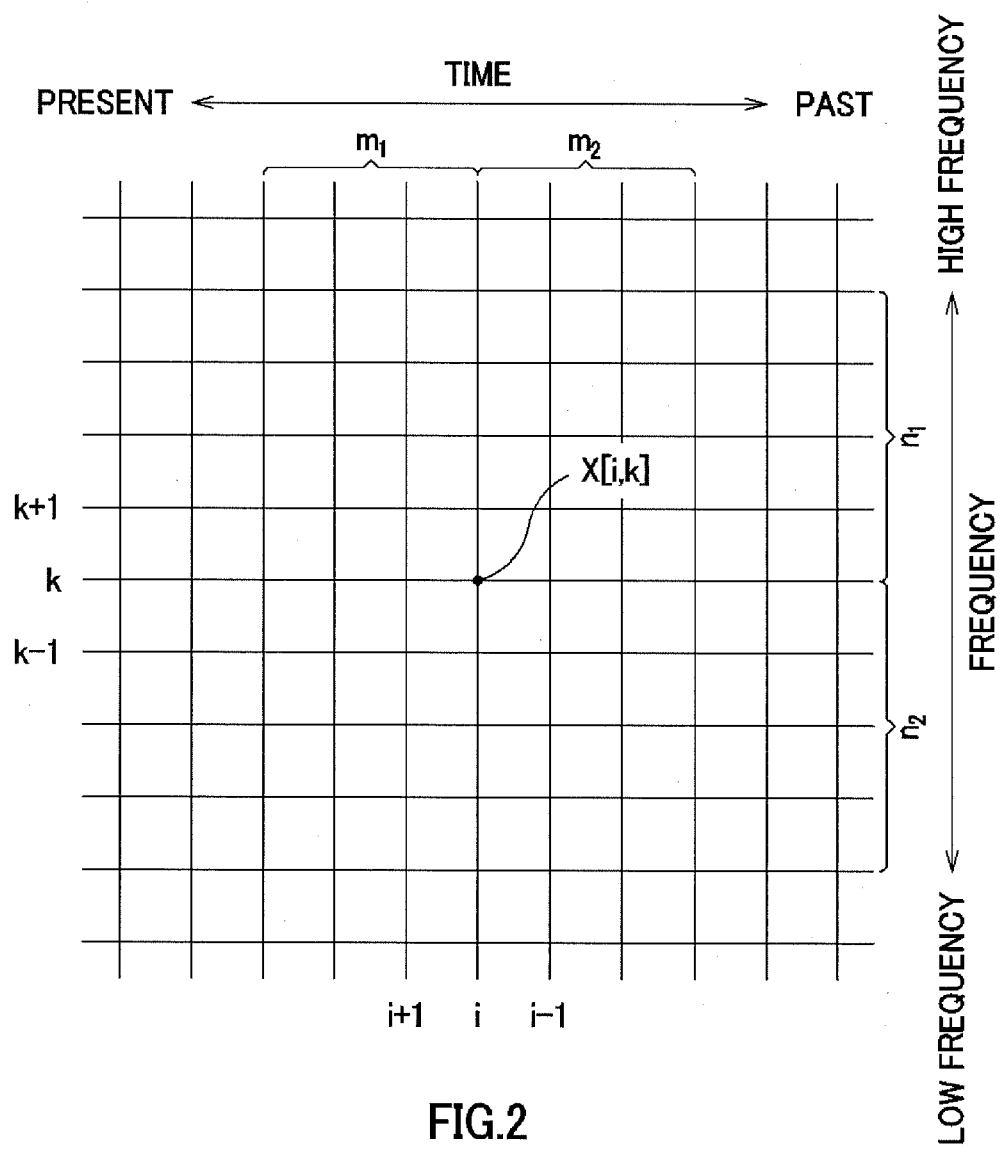
FIG. 2 shows a time-frequency plane generated by a frequency conversion conducted in a time-frequency conversion unit, and an example of signal data displayed on the time-frequency plane according to one or more embodiments of the present invention.

By using any of the above-mentioned techniques and method, each of the time-frequency conversion units 11a and 11b time-divides an input signal in the time domain into, for example, each of frames, and then converts each of them to a signal in the frequency domain so as to generate a distribution of signal data on a time-frequency plane composed of a time-axis and a frequency-axis. The signal data on the time-frequency plane thus generated can be shown in FIG. 2. In FIG. 2, the axis of abscissas indicates the time-axis and the axis of ordinates indicates the frequency-axis. The time-axis takes the direction of time flow from the right side to the left side, with the frequency-axis having a direction of the increasing frequency from below upward. Supposing that coordinates on the time-frequency plane are indicated by (i, k), signal data located at the coordinates (i, k) is represented by X[i, k]. In the case when the signal data is dealt as discrete data, the notation of X[i, k] represents signal data located at the i-th number on the time-axis and the k-th number on the frequency-axis. Additionally, when signal data on the time-frequency plane is mentioned, the data is not necessarily required to have the signal data as one batch data corresponding to all the time at a specific point of time, and may include such data as to be formed into signal data on the time-frequency plane when accumulated for a predetermined period of time. For example, when an input signal is inputted in real time, the converted signal data may be accumulated in a buffer from the point of time at which the conversion process is started, with the accumulated data in the buffer being discarded from the oldest signal data.

Each of the signal data X[i, k] on the time-frequency plane is inputted to the signal processing unit 15. The signal processing unit 15 mixes the signal data X[i, k] through operations on the time-frequency plane, and generates a mixed output on the time-frequency plane.

The mixed output generated in the signal processing unit is inputted to the frequency-time conversion unit 25. The frequency-time conversion unit 25 converts the mixed output into a signal in the time domain, and outputs this as an output signal S(n). The conversion of the signal in the frequency domain into a signal in the time domain is realized by a conventionally-known conversion method, such as an inverse fast Fourier transform or the like, and a conversion circuit or the like. An inverse conversion method corresponding to the conversion method used in the time-frequency conversion units 11a and 11b may be used.

(2) Operation Principle and Specific Example

Suppose that one of input signals in the time domain is A(n) and that the other is B(n). In the case when, supposing that the input signal A(n) is derived from a musical instrument with a high volume such as an electric guitar and that the input signal B(n) is a voice, these signals are simply added, it becomes difficult to hear the voice while the musical instrument with a high volume is being played. Therefore, in the mixing device according to one or more embodiments of the present invention, at least one signal of two or more input signals is preliminarily set as a priority signal that is a signal having priority to the other signals in order to increase the degree of clearness, with the other signals being set as non-priority signals. Then, by executing a priority operation in which the amplitudes and phases of the respective signal data are respectively operation-processed on the time-frequency plane, the degree of clearness of the priority signal is increased so that it becomes possible to prevent the priority signal from being buried by the non-priory signals. For example, by setting a voice as the priority signal with the sound of an electric guitar being set as the non-priority signal, the voice, which has been buried by the sound of the electric guitar and has not been heard in the prior art, is made to be clearly heard.

The input signal A(n) (for example, sound of an electric guitar) is determined as the non-priority signal and the input signal B(n) (for example, voice) is determined as the priority signal. Moreover, suppose that signal data at coordinates (i, k) on a time-frequency plane generated by the time-frequency conversion unit 11a which receives the input signal A(n) is represented by $X_A[i, k]$. In the same manner, suppose that signal data at coordinates (i, k) generated by the time-frequency conversion unit 11b which receives the input signal B(n) is represented by $X_B[i, k]$. The signal data $X_A[i, k]$ and $X_B[i, k]$ are respectively expressed as a complex number composed of amplitudes $R_A[i, k]$ and $R_B[i, k]$ as well as phases $\phi_A[i, k]$ and $\phi_B[i, k]$. That is, the following formulas are satisfied.

[Formula 1]

$$X_A[i,k] = R_A[i,k]\exp j\phi_A[i,k] \quad (1)$$

[Formula 2]

$$X_B[i,k] = R_B[i,k]\exp j\phi_B[i,k] \quad (2)$$

When the input signal A(n) and the input signal B(n) are simply added by using weighted ratio $W_A:W_B$ which are desirably set, an output signal S(n) after a mixing process is represented by the following formula.

[Formula 3]

$$S(n) = W_A A(n) + W_B B(n) \quad (3)$$

When this is expressed by signal data on a time-frequency plane, and when substituted by formulas (1) and (2), a mixed output $X_S[i, k]$ on the time-frequency plane are represented by the following formula.

[Formula 4]

$$\begin{aligned} X_S[i, k] &= W_A X_A[i, k] + W_B X_B[i, k] \\ &= W_A R_A[i, k]\exp j\Phi_A[i, k] + W_B R_B[i, k]\exp j\Phi_B[i, k] \end{aligned} \quad (4)$$

In this case, when the phases of the two signals are shifted from each other by about 180 degrees, the respective signals are cancelled out, and the signal having a smaller amplitude is buried by a signal having a larger amplitude. Alternatively, in the case when the sizes of the amplitudes are about the same, the volumes of the respective signals are lowered. Therefore, one or both of the phases of the two signals are forcefully shifted so as to prevent the cancellation of the signals. More specifically, in order to make the phase of the signal data $X_A[i, k]$ of the non-priority signal coincident with the phase of the signal data $X_B[i, k]$ of the priority signal, a constant $0<\beta<1$ is determined, and a weighted sum of the phases is calculated relative to β. Moreover, in order to adjust the amplitude of the signal data $X_A[i, k]$ of the non-priority signal, a constant $0<\alpha<1$ is determined, and the amplitude of the signal data $X_A[i, k]$ of the non-priority signal is multiplied by this constant. By these processes, signal data $X_S[i, k]$ of a mixed output can be represented by the following formula.

[Formula 5]

$$X_S[i, k] = \alpha W_A R_A[i, k]\exp j\left\{ \begin{array}{l} \beta\Phi_B[i, k] + \\ (1-\beta)\Phi_A[i, k] \end{array} \right\} + W_B X_B[i, k] \quad (5)$$

In this case, with respect to $\phi_B$ and $\phi_A$, a weighted mean of β: (1β) is calculated; however, since the phase has a periodic property of 2π, it is needless to say that the weighted mean represents a specific value in which this periodic property is taken into consideration. In other words, the calculation is not carried out literally as indicated by the formula, but is carried out in the following manner, that is, of two arcs connecting two points of a point B of a deflection angle $\phi_B$ and a point A of a defection angle $\phi_A$, on a unit circle, a point C at which the shorter arc is internally divided by β: (1−β) is obtained so that the deflection angle of the point C is defined as an angle given as a result of the weighted mean. Formula (5) represents these calculations as an expression of the weighted mean for the sake of convenience. With respect to the operation of the phase, the same processes are carried out in the following description.

Additionally, with respect to the signal data $X_B[i, k]$ set as the priority signal, since operation processes are not carried out in each of the amplitude and phase, no expressions in which the phase and the amplitude are decomposed are used.

By determining β as a value close to 1 within the above-mentioned range, the phase of the data $X_A[i, k]$ of the non-priority signal is set to be close to the phase of the data $X_B[i, k]$ of the priority signal. Moreover, even by determining α as a value close to 1 within the above-mentioned range, the amplitude of the signal data $X_A[i, k]$ is not made so smaller conspicuously so that it is possible to prevent such a reduction of the volume as to make the listener feel a stress.

Thus, the signal data $X_B[i, k]$ set as the priority signal is prevented from being cancelled by the signal data $X_A[i, k]$ set as the non-priority signal so that since the degree of clearness can be improved, the sound of the priority signal can be clearly heard.

In the above description, priority operation processes are carried out on the amplitude and phase of the signal data $X_A[i, k]$ of the non-priority signal; however, without carrying out any operations on the signal data $X_A[i, k]$, priority operation processes may be carried out only on the amplitude and phase of the signal data $X_B[i, k]$ of the priority signal. In the case when operation processes are carried out on the amplitude and phase of the signal data $X_B[i, k]$ on the priority signal, in order to adjust the amplitude of the signal data $X_B[i, k]$ of the non-priority signal, a constant $\gamma$ is determined so as to satisfy $\gamma>1$, and the amplitude of the priority signal is multiplied by this. Moreover, in order to make the phase of the signal data $X_B[i, k]$ coincident with the phase of the signal data $X_A[i, k]$, a constant satisfying $0<\eta<1$ is determined, and a weighted sum of the phases is taken with respect to $\eta$. Therefore, a mixed output $X_S'[i, k]$ is represented by the following formula.

[Formula 6]

$$X_S'[i, k] = W_A X_A[i, k] + \gamma W_B X_B[i, k] \exp j\{\eta \Phi_A[i, k] + (1-\eta)\Phi_B[i, k]\} \quad (6)$$

In this manner, not limited to carrying out operations on the amplitude and/or phase of the signal data of either the priority signal or the non-priority signal, operations may be carried out on the amplitude and phase of all the signal data. In this case, a mixed output $X_S''[i, k]$ is represented by the following formula.

[Formula 7]

$$X_S''[i, k] = \alpha W_A R_A[i, k] \exp j\{\beta \Phi_B[i, k] + (1-\beta)\Phi_A[i, k]\} + \gamma W_B R_B[i, k] \exp j\{\eta \Phi_A[i, k] + (1-\eta)\Phi_B[i, k]\} \quad (7)$$

With respect to values of coefficients $\alpha$, $\beta$, $\gamma$, $\eta$ or the like for use in priority operations, desired values may be set, and not limited to fixed values, in accordance with a music that proceeds, desired operations corresponding to the purpose of a mixer operator may be carried out while executing the mixing process. Moreover, the values of coefficients $\alpha$, $\beta$, $\gamma$, $\eta$ or the like may be changed in a time-sharing manner by using a so-called automation function. In the case when two or more priority signals are determined, settings may be made for each of the input signals, and those values may be altered from moment to moment. Additionally, by desirably operating the values of the coefficients $\alpha$, $\beta$, $\gamma$, $\eta$ or the like, not limited to operating both of the amplitude and phase, only either one of the operations of the amplitude and phase may be carried out.

The above-mentioned priority operations are carried out on all the coordinates (i, k), and the generated mixed output on the time-frequency plane is converted to a signal in the time domain by the frequency-time conversion unit 25 so that a desired output signal S(n) can be obtained.

Operations are carried out so as to make the phase of the signal data of the non-priority signal coincident with the phase of the signal data of the priority signal, and by adjusting the amplitude of the signal data, it becomes possible to prevent the priority signal from being cancelled by the non-priority signal. For this reason, without the necessity of increasing the volume of the priority signal to a great degree as well as of reducing the volume of the non-priority signal to a great degree, the degree of clearness of the priority signal is increased so that it becomes possible to provide a clear listening process.

With respect to the data of the input signal, all the data of music and a voice may be inputted as files, or may be inputted as data of real-time input signals through a microphone, an amplifier or the like. Alternatively, the data of the input signal may be prepared as packet data, and this may be inputted for each of packets, or the packet may be further divided, and inputted.

Additionally, the functions of the above-mentioned mixing device may be realized on a software basis by using a mixing program to be described later.

(3) Other Specific Examples (a) Specific Example 1

In the case of the above-mentioned smart mixer, since priority operation processes are carried out on the amplitude and phase of signal data of the priority signal and/or the non-priority signal, the signal data is different from the signal data of the original sound. For this reason, the sound quality of the mixed output thus generated might be lowered depending on degrees of the priority operation.

The following description will discuss a principle and a configuration for reducing the degradation of the sound quality by utilizing the fact that the input signal of a musical instrument sound, a voice or the like tends to have its energy of the signal data sparsely located on the time-frequency plane in many cases.

With respect to components of the priority signal having a low energy on the time-frequency plane, since these components are not required components originally, there is no possibility of causing a failure due to interruption from the other signal data. Therefore, by executing the above-mentioned priority operation only on signal data having a high energy, a simple adding operation is carried out on signal data having a low energy so that the ratio of the signal data required for priority operations relative to the entire signal data can be reduced; thus, a signal output that is closer to the original sound can be obtained, thereby making it possible to improve the sound quality.

Even in a domain where energy is concentrated on the time-frequency plane, since there is a possibility of having 0 accidentally in an energy value at a specific point, in the case when the availability of the priority operation is determined for each of the signal data based upon the sizes of energy, a problem may be raised in many cases. Therefore, the maximum value of energy is retrieved in a domain in the vicinity of signal data on the time-frequency plane to be subjected to an operation process, and by comparing the value with a threshold value preliminarily set, a sound presence judgment representing whether or not a sound is present is calculated so that a sound presence judgment distribution is generated. Then, in accordance with the sound presence judgment distribution, with respect to signal data relating to coordinates determined as the presence of sound, a priority operation is executed, while in the other case, an adding operation is simply executed.

With respect to coordinates (i, k) on the time-frequency plane as shown in FIG. 2, suppose that there is a neighborhood region U having a width $m_1$ in the future direction and a width $m_2$ in the past direction on the time axis, with a width $n_1$ in a high-frequency direction and a width $n_2$ in a low-frequency direction on the frequency axis. Supposing that arbitrary coordinates (g, h) are located within the neighborhood region U, the maximum value of the square of the amplitude of signal data X[g, h] on the coordinates (g, h) is retrieved within the neighborhood region U. In the case when the maximum value of $|X[g, h]|^2$ is greater than a predetermined threshold value $T_Q[k]$, the sound presence judgment distribution Q[i, k]=1 is determined on the time-frequency plane. In the other cases, Q[i, k]=0 is determined. These are indicated as a formula described below.

[Formula 8]

$$Q[i, k] = \begin{cases} 1 & \left( \max_{(g,h) \in U} |X[g, h]|^2 \geq T_Q[k] \right) \\ 0 & \text{(except for the above)} \end{cases} \quad (8)$$

By executing the above-mentioned calculations on all the coordinates (i, k), a sound presence judgment distribution on the time-frequency plane can be obtained.

Additionally, in the above description, the shape of the neighborhood region relating to the coordinates (i, k) is set into a rectangular shape by using widths $m_1$, $m_2$, $n_1$ and $n_2$; however, these widths may be changed depending on time i in accordance with proceeding of music, or these may be changed depending on frequency k in accordance with masking characteristics of human hearing sense. Moreover, the shape of the neighborhood region is not particularly limited by the rectangular shape, and may be set to a trapezoidal shape, or may be set to various shapes, such as a round shape, an elliptical shape, a triangular shape, or the like. Furthermore, by changing the parameters $m_1$, $m_2$, $n_1$ and $n_2$ in the neighborhood region U relative to a single input signal, a plurality of sound presence judgment distributions Q[i, k] may be generated.

Additionally, the neighborhood region relative to a certain point on the time-frequency plane is not limited to a domain located within a predetermined range from the point on the time-frequency plane, and may include a domain located within a predetermined range representing multiple sound components of the sound indicated by the point.

As the determining conditions of the sound presence judgment distribution Q[i, k], it is possible to use not only the maximum value of energy of the above-mentioned signal data X[g, h], but also the average value of energies of the signal data or the average value of amplitudes of the signal data or the like within the neighborhood region U. Moreover, without using a binarizing process as described above, Q[i, k] may be defined as a continuous amount, for example, in accordance with the maximum value of energy of signal data. In the case when Q[i, k] is defined as the continuous amount, Q[i, k] may be defined not only as an amount having a linear relationship with energy or amplitude, but also as a function having a non-linear relationship therewith. Moreover, upon evaluating Q[i, k] within the neighborhood region U by using the maximum value or average value, for example, a weighting process may be carried out depending on the distance from coordinates (i, k) on the time-frequency plane. Furthermore, based upon data of masking effects in human hearing characteristics, the distance and threshold value of the neighborhood region on the time-frequency plane may be determined. The threshold value $T_Q[k]$ may be a preliminarily set fixed value or a variable value that is varied depending on the input signal intensity or the output signal intensity. This may be adjusted manually by the operator of the smart mixer.

In the case of the sound presence judgment distribution Q[i, k]=1, that is, when the presence of sound is determined, a priority operation for adjusting the amplitude and phase of signal data on the time-frequency plane is carried out, while in the case of the sound presence judgment distribution Q[i, k]=0, without carrying out the adjustments of the amplitude and phase of the signal data, a simple adding operation is carried out. By using this method, the sound of an input signal which is attempted to increase the degree of clearness can be mixed without being buried by sounds of another input signal, and it becomes possible to carry out a mixing process with degradation of sound quality being limited to the minimum level with respect to each of signals.

Figure 3:
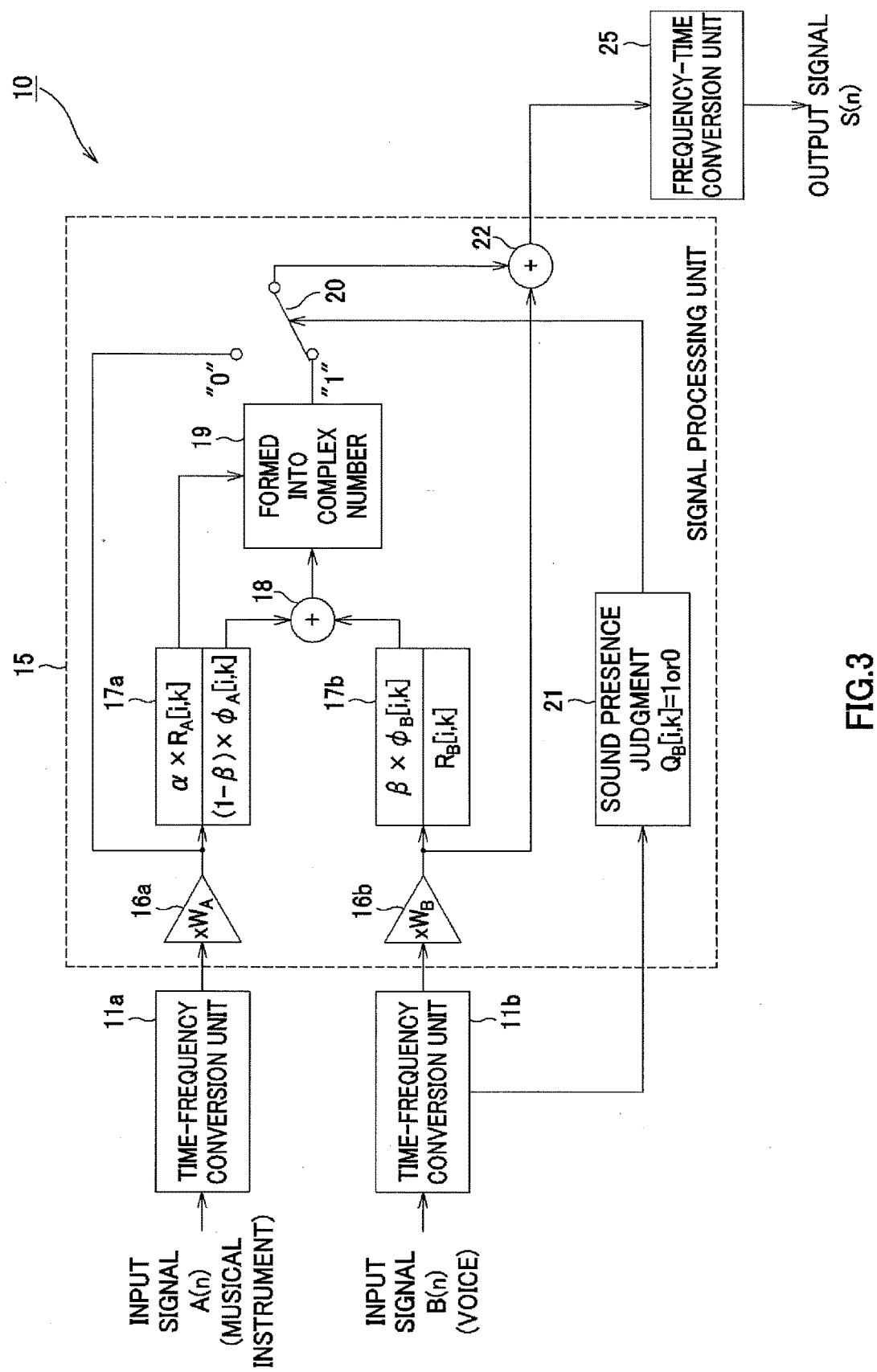
FIG. 3 is a block diagram showing a structural example of the mixing device of one or more embodiments of the present invention, which includes a configuration for carrying out a priority operation and a configuration in which by generating a sound presence judgment distribution based upon signal data of a priority signal, a mixed output is controlled based upon the sound presence judgment distribution thus generated.
Figure 4:
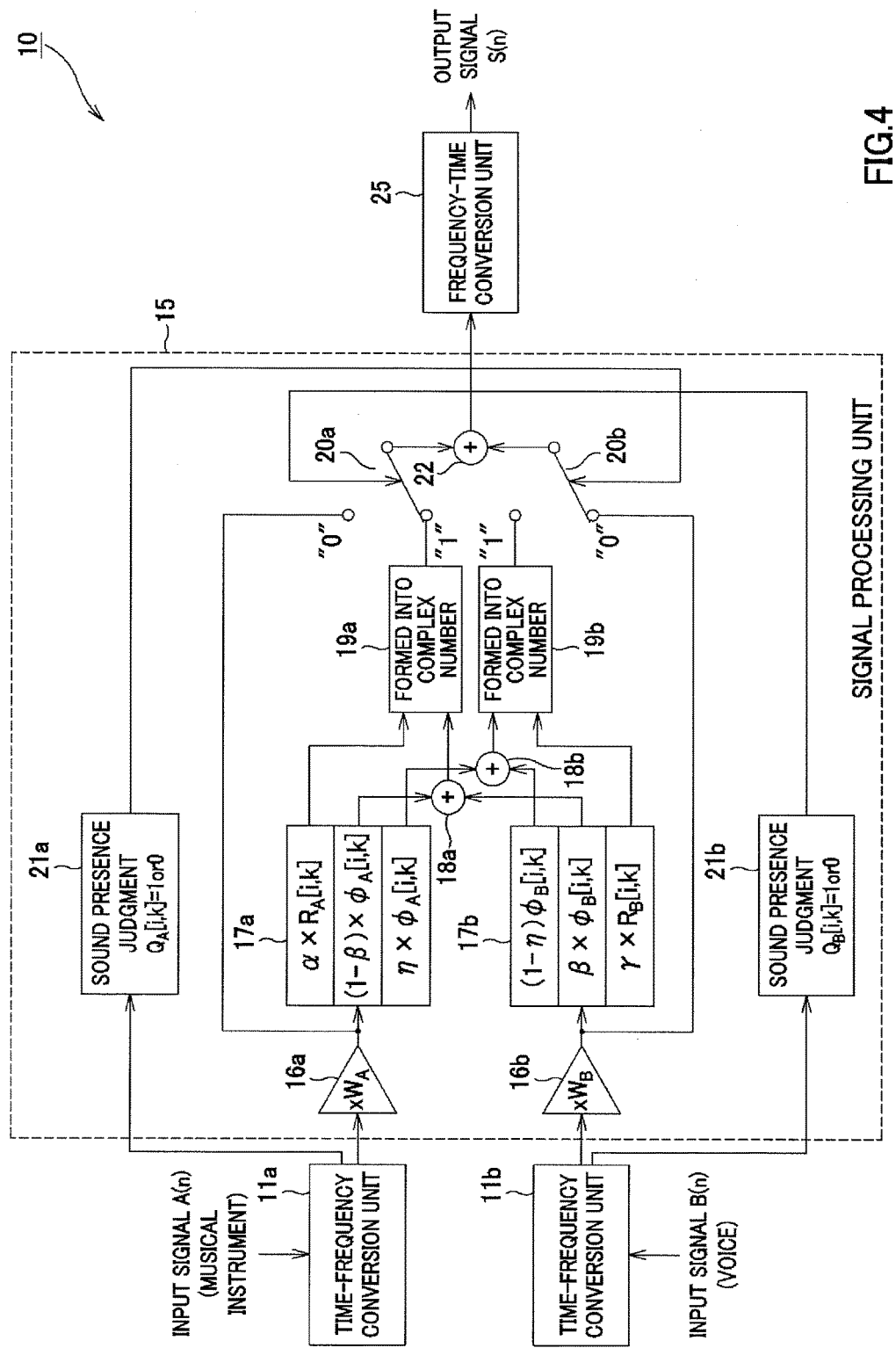
FIG. 4 is a block diagram showing a structural example of the mixing device of one or more embodiments of the present invention, which includes a configuration for carrying out a priority operation and a configuration in which by generating sound presence judgment distributions based upon both of signal data of a priority signal and a non-priority signal, a mixed output is controlled based upon the sound presence judgment distributions thus generated.

FIGS. 3 and 4 are block diagrams showing a structural example of a smart mixer to which the sound presence judgment function is applied.

A mixing device 10 shown in FIG. 3 has its input signal A(n) set as a non-priority signal and its input signal B(n) set as a priority signal. The two input signals A(n) and B(n) in the time domain are respectively inputted to the time-frequency conversion units 11a and 11b. The input signals thus inputted are converted into signals in the frequency domain by a known conversion method, such as a short-time fast Fourier Transform, or the like, in the time-frequency conversion units 11a and 11b so that signal data $X_A[i, k]$ and $X_B[i, k]$ are generated on the time-frequency plane composed of the time-axis and the frequency-axis. The signal data $X_A[i, k]$ and $X_B[i, k]$ are respectively inputted to coefficient units 16a and 16b inside the signal processing unit 15. The coefficient units 16a and 16b respectively multiply the inputted signal data $X_A[i, k]$ and $X_B[i, k]$ by $W_A$ times and $W_B$ times. The coefficient units 16a and 16b are respectively connected to amplitude/phase operation units 17a and 17b.

The amplitude/phase operation units 17a and 17b calculate the amplitudes and phases of the signal data $X_A[i, k]$ and $X_B[i, k]$ in a different manner respectively. With respect to the signal data $X_A[i, k]$ multiplied by $W_A$ times outputted by the coefficient unit 16a, its amplitude $R_A[i, k]$ is multiplied by a times by using a preliminarily set constant α, and its phase $\phi_A[i, k]$ is multiplied by (1−β) times by using a preliminarily set constant β. With respect to the signal data $X_B[i, k]$ outputted from the coefficient unit 16b, its phase $\phi_B[i, k]$ is multiplied by β times by using the preliminarily set constant β in the amplitude/phase operation unit 17b. No operation is carried out on its amplitude $R_B[i, k]$. The phases calculated in the amplitude/phase operation units 17a and 17b are added in an adder 18, and the result of the adding process and the amplitude $R_A[i, k]$ multiplied by a times are inputted to a complex number operation unit 19 so that the result of the priority operation of formula (9) is obtained.

[Formula 9]

$$\alpha W_A R_A[i,k] \exp j\{\beta \phi_B[i,k] + (1-\beta)\phi_A[i,k]\} \quad (9)$$

A sound presence judgment is carried out on the input signal B(n) set as the priority signal, and when determined as the presence of sound, the above-mentioned priority operation is carried out, while, when determined as no sound present, a simple addition is carried out. With respect to the determination as the presence of sound on the input signal B(n) side, in the case of $Q_B[i, k]=1$ in the sound presence judgment unit (signal characteristic judgment unit) 21, the output of the complex number operation unit 19 and the output of the coefficient unit 16b are added to each other by an adder 22 by the prior operation control unit 20, and the resulting signal is outputted to the frequency-time conversion unit 25 as a mixed output. In the case of $Q_B[i, k]=0$ in the sound presence judgment unit 21, the prior operation control unit 20 doesn't output the result of the priority operation, and adds the outputs of the two coefficient units 16a and 16b, as they are, and the resulting signal is outputted to the frequency-time conversion unit 25 as a mixed output. The mixed output is represented by the following formula.

[Formula 10]

$$X_S[i, k] = \begin{cases} \alpha W_A R_A[i,k] \exp j \begin{Bmatrix} \beta \Phi_B[i,k] + \\ (1-\beta)\Phi_A[i,k] \end{Bmatrix} + W_B X_B[i,k] & (Q_B[i,k]=1) \\ W_A X_A[i,k] + W_B X_B[i,k] & (Q_B[i,k]=0) \end{cases} \quad (10)$$

In the structural example of a smart mixer shown in FIG. 3, the sound presence judgment is carried out only on the priority signal side; however, in the structural example of a smart mixer shown in FIG. 4, the sound presence judgment is carried out on both of the priority signal side and the non-priority signal side.

In the structural example of the smart mixer shown in FIG. 4, in the same manner as in the structural example of FIG. 3, its input signal A(n) is set as a non-priority signal and its input signal B(n) is set as a priority signal. The two input signals A(n) and B(n) in the time domain are respectively inputted to the time-frequency conversion units 11a and 11b. The input signals thus inputted are converted into signals in the frequency domain by a short-time FFT method in the time-frequency conversion units 11a and 11b so that signal data $X_A[i, k]$ and $X_B[i, k]$ are generated on the time-frequency plane composed of the time-axis and the frequency-axis. The signal data $X_A[i, k]$ and $X_B[i, k]$ are respectively inputted to coefficient units 16a and 16b inside the signal processing unit 15. The coefficient units 16a and 16b respectively multiply the inputted signal data $X_A[i, k]$ and $X_B[i, k]$ by $W_A$ times and $W_B$ times. The coefficient units 16a and 16b are respectively connected to amplitude/phase operation units 17a and 17b. The amplitude/phase operation units 17a and 17b calculate the amplitudes and phases of the signal data $X_A[i, k]$ and $X_B[i, k]$ in a different manner respectively for priority operations. With respect to the signal data $X_A[i, k]$ outputted by the coefficient unit 16a, its amplitude $R_A[i, k]$ is multiplied by $\alpha$ times by using a preliminarily set constant $\alpha$, and its phase $\phi_A[i, k]$ is multiplied by $(1-\beta)$ times by using a preliminarily set constant $\beta$, and further multiplied by $\eta$ times by using a constant $\eta$ preliminarily set independently from the constant $\beta$. With respect to the signal data $X_B[i, k]$ outputted from the coefficient unit 16b, its amplitude is multiplied by $\gamma$ times by using the preliminarily set constant $\gamma$ in the amplitude/phase operation unit 17b, and its phase $\phi_B[i, k]$ is multiplied by $\beta$ times by using a preliminarily set constant $\beta$, and further multiplied by $(1-\eta)$ times by using the preliminarily set constant $\eta$. The phase $\phi_A$ multiplied by $(1-\beta)$ times in the amplitude/phase operation unit 17a and the phase $\phi_B$ multiplied by $\beta$ times in the amplitude/phase operation unit 17b are added to each other by an adder 18a so that these are inputted to a complex number operation unit 19a together with the amplitude multiplied by $\alpha$ times so as to be formed into a complex number. In the same manner, the phase $\phi_A$ multiplied by $\eta$ times in the amplitude/phase operation unit 17b and the phase $\phi_B$ multiplied by $(1-\eta)$ times in the amplitude/phase operation unit 17b are added to each other by an adder 18b so that these are inputted to a complex number operation unit 19b together with the amplitude multiplied by $\gamma$ times so as to be formed into a complex number. As a result of these priority operations, the input signal A(n) side is represented by the following formula (11) and the input signal B(n) side is represented by the following formula (12).

[Formula 11]

$$\alpha W_A R_A[i,k] \exp j\{\beta \phi_B[i,k]+(1-\beta)\phi_A[i,k]\} \quad (11)$$

[Formula 12]

$$\gamma W_B R_B[i,k] \exp j\{\eta \phi_A[i,k]+(1-\eta)\phi_B[i,k]\} \quad (12)$$

A sound presence judgment is carried out on each of the input signal A(n) set as the non-priority signal and the input signal B(n) set as the priority signal. In the case when determined as the presence of sound on both of the input signal A(n) side and the input signal B(n) side, that is, in the case of $Q_A[i, k]=Q_B[i, k]=1$, the results of priority operations from formula (11) and formula (12) by priority operation control units 20a and 20b are added to each other by using an adder 22 so that a mixed output is obtained. In the case when no sound is present on the input signal A(n) side with the presence of sound being determined on the input signal B(n) side, that is, in the case of $Q_A[i, k]=0$, while $Q_B[i, k]=1$, the value of formula (11) and the output of the coefficient unit 16b are added to each other by the priority operation control units 20a and 20b. In the case when the presence of sound is determined on the input signal A(n) side, with no sound being present on the input signal B(n) side, that is, in the case of $Q_A[i, k]=1$, while $Q_B[i, k]=0$, the output of the coefficient unit 16a and the value of formula (12) are added to each other by the priority operation control units 20a and 20b. In the case when it is determined that no sound is present on both of the input signal A(n) side and the input signal B(n) side, that is, in the case of $Q_A[i, k]=Q_B[i, k]=0$, a simple adding process is carried out by adding the outputs of the coefficient units 16a and 16b by the priority operation control units 20a and 20b so that a mixed output is obtained. When these processes are summarized, the following formula (13) is obtained.

[Formula 13]

$$X_S[i, k] = \begin{cases} \alpha W_A R_A[i,k] \exp j \begin{Bmatrix} \beta \Phi_B[i,k] + \\ (1-\beta)\Phi_A[i,k] \end{Bmatrix} + & \\ \gamma W_B R_B[i,k] \exp j \begin{Bmatrix} \eta \Phi_A[i,k] + \\ (1-\eta)\Phi_B[i,k] \end{Bmatrix} & (Q_A[i,k]=1, Q_B[i,k]=1) \\ \alpha W_A R_A[i,k] \exp j \begin{Bmatrix} \beta \Phi_B[i,k] + \\ (1-\beta)\Phi_A[i,k] \end{Bmatrix} + & \\ W_B X_B[i,k] & (Q_A[i,k]=0, Q_B[i,k]=1) \\ W_A X_A[i,k] + & \\ \gamma W_B R_B[i,k] \exp j \begin{Bmatrix} \eta \Phi_A[i,k] + \\ (1-\eta)\Phi_B[i,k] \end{Bmatrix} & (Q_A[i,k]=1, Q_B[i,k]=0) \\ W_A X_A[i,k] + W_B X_B[i,k] & (Q_A[i,k]=0, Q_B[i,k]=0) \end{cases} \quad (13)$$

The mixed output to be outputted from the adder 22 is outputted by the frequency-time conversion unit 25 as a mixed output in the time domain.

The coefficients α, β, γ, η, and the like for use in priority operations may be fixed values, or may be adjusted while being mixed in the same manner as described earlier. Moreover, the sound presence judgment distribution may be prepared as a continuous amount, and these parameters for priority operations may be continuously changed linearly or non-linearly in association with the continuous amount.

In the case of FIG. 3, a sound presence judgment distribution is generated only on the priority signal side, and in the structural example of FIG. 4, a sound presence judgment distribution is generated on both of the priority signal and the non-priority signal; however, another configuration may be formed in which a sound presence judgment distribution is generated only on the non-priority signal side.

Additionally, in any of the cases, with respect to the settings of the priority signal and the non-priority signal, fixed settings are not necessarily required, and switching may be mutually made in time series, or switching may be made in accordance with frequencies. For example, as shown in FIG. 4, such a controlling process may be proposed in which by preparing symmetrical configurations, a sound on a side having predominant energy depending on domains on the time-frequency plane is defined as a priority signal in the corresponding domain, and in another domain, when energy becomes inferior, switching is made to a non-priority signal. Moreover, in the case when three or more input signals are prepared, the priority signal and the non-priority signal may be desirably switched and utilized.

By generating the above-mentioned sound presence judgment distribution, since upon determination that no sound is present, a simple adding operation can be executed, it becomes possible to reduce the calculation load of the mixing device, and also to prevent degradation of sound quality caused by a distortion in a signal waveform due to priority operations.

(b) Specific Example 2

In the above-mentioned specific example 1, the sound presence judgment is executed, and only when a determination is made such that sound is present, a priority operation is executed on signal data on the time-frequency plane to output the result, and in the other cases, without carrying out the priority operation, only an output for a simple adding operation is given. Thus, it is possible to prevent a distortion in a signal waveform; in this case, however, since the phase of an input signal is forcefully altered, with the result that when a sound derived from the mixed output signal is heard, an unnatural sense of hearing tends to be caused.

Therefore, the following description will discuss a configuration of a smart mixer in which a difference between a phase of signal data prior to a priority operation and a phase of signal data after the priority operation is defined as a phase adjustment amount, and by providing an upper limit to the phase adjustment amount, an attempt is made so as to reduce the unnatural sense of hearing.

Suppose that the phase adjusting amount relative to signal data $X_A[i, k]$ on an input signal A(n) side at coordinates (i, k) on the time-frequency plane is represented by $\delta[i, k]$ and that at time i−1, the phase adjustment has been completed, with the phase adjusting amount at this time being defined as $\delta[i-1, k]$. In this case, so as not to cause a difference in the phase adjusting amounts exceeding an upper limit, a function Sat whose output is saturated at a fixed value μ preliminarily set is defined in the following manner.

[Formula 14]

$$Sat(\theta, \mu) = \begin{cases} \mu & (\mu < \theta) \\ 0 & (-\mu \leq \theta \leq \mu) \\ -\mu & (\theta < -\mu) \end{cases} \quad (14)$$

Then, the phase adjusting amount $\delta[i, k]$ is represented by the following formula.

[Formula 15]

$$\delta[i,k]=Sat\{\beta(\phi_B[i,k])-\phi_A[i,k])-\delta[i-1,k]\}+\delta[i,k] \quad (15)$$

When a priority operation is executed on the signal data $X_A[i, k]$ with the relationship of formula (15) being incorporated therein, the following formula is obtained.

[Formula 16]

$$\alpha W_A R_A[i,k] \exp j(\phi_A[i,k]+\delta[i,k]) \quad (16)$$

Figure 5:
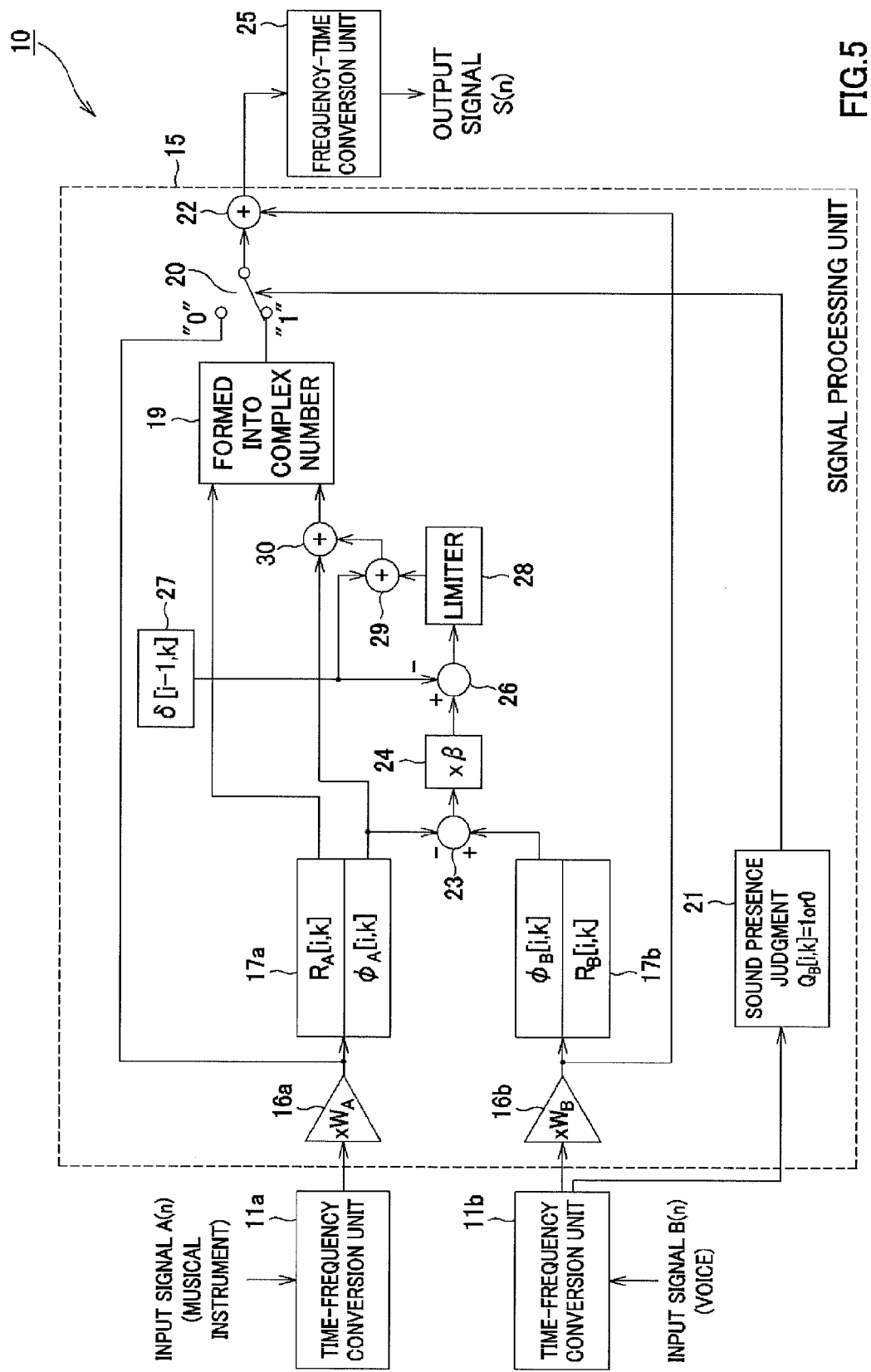
FIG. 5 is a block diagram showing a structural example of the mixing device of one or more embodiments of the present invention, which includes a configuration for limiting a phase adjusting amount upon carrying out a priority operation, and a configuration in which by generating a sound presence judgment distribution based upon signal data of a priority signal, a mixed output is controlled based upon the sound presence judgment distribution thus generated.

FIG. 5 is a block diagram showing a structural example of a smart mixer that outputs the result of the priority operation calculated based upon formula (15) in accordance with a sound presence judgment carried out only on the input signal B(n) side.

In the same manner as in the case of FIG. 3 and FIG. 4, the mixing device 10 sets the input signal A(n) as a non-priority signal and the input signal B(n) as a priority signal as shown in FIG. 5. The two input signals A(n) and B(n) in the time domain are respectively inputted to the time-frequency conversion units 11a and 11b. The input signals are converted into signals in the frequency domain by a short-time FFT or the like in the time-frequency conversion units 11a and 11b for each of the frames so that signal data $X_A[i, k]$ and $X_B[i, k]$ are generated on the time-frequency plane composed of the time-axis and the frequency-axis. The signal data $X_A[i, k]$ and $X_B[i, k]$ are respectively inputted to coefficient units 16a and 16b inside the signal processing unit 15. The coefficient units 16a and 16b respectively multiply the inputted signal data $X_A[i, k]$ and $X_B[i, k]$ by $W_A$ times and $W_B$ times.

The coefficient units 16a and 16b are respectively connected to amplitude/phase operation units 17a and 17b. The amplitude/phase operation units 17a and 17b calculate the amplitudes and phases of the signal data $X_A[i, k]$ and $X_B[i, k]$ in a different manner respectively. A finite difference between the phase $\phi_A[i, k]$ on the input signal A(n) side and the phase $\phi_B[i, k]$ on the input signal B(n) side is found by an adder-subtracter 23, and the result is multiplied by β times by using a coefficient unit 24. The finite difference of the phases multiplied by β times is used for further finding a finite difference from the phase adjusting amount $\delta[i-1, k]$ at a point of time immediately before the current time, stored in the phase adjusting amount storing unit 27 by an adder-subtracter 26, and the resulting value is inputted to a limiter 28. The output of the limiter 28 and the phase adjusting amount $\delta[i-1, k]$ are added to each other by an adder 29, and further added to $\phi_A[i, k]$ by an adder 30. By using the phase obtained as described above and the amplitude $R_A[i, k]$ on the input signal A(n) side, a complex number is formed in the complex number operation unit 19.

A sound presence judgment is carried out on the input signal B(n) set as the priority signal, and upon determination that sound is present, the result of the priority operation by formula (17) is outputted, while upon determination that no sound is present, a simple adding operation is executed. In order to realize these processes, in the case of $Q_B[i, k]=1$ in the sound presence judgment unit 21, the priority operation control unit 20 allows the adder 22 to add the output of the complex number operation unit 19 and the output of the coefficient unit 16b to each other, and outputs to the frequency-time conversion unit 25 as a mixed output. In the case of $Q_B[i, k]=0$ in the sound presence judgment unit 21, the priority operation control unit 20 does not output the result of the priority operation, and adds the outputs of the two coefficient units 16a and 16b, as they are, to each other to form a mixed output, and outputs this to the frequency-time conversion unit 25. The mixed output is represented by the following formula.

[Formula 17]

$$X_S[i, k] = \begin{cases} \alpha W_A R_A[i, k] \exp j(\Phi_A[i, k] + \delta[i, k]) + & (Q_B[i, k] = 1) \\ W_B X_B[i, k] \\ W_A X_A[i, k] + W_B X_B[i, k] & (Q_B[i, k] = 0) \end{cases} \quad (17)$$

Additionally, in addition to using the above-mentioned formula (14) as the function of the limiter 28, a smooth non-linear function may of course be used. Moreover, upon calculating formula (16), only the phase adjusting amount in the time-axis direction has been taken into consideration; however, in place of this, $\delta[i, k]$ and $\delta[i, k-1]$ may be used as the phase adjusting amount in the frequency-axis direction, and limitations may easily be given to the phase adjusting amount in both of the time-axis direction and the frequency-axis direction.

In the same manner as in the aforementioned specific example 1, the parameters $\alpha$, $\beta$, etc. for priority operation may be desirably set, and adjusted. Moreover, with respect to the generation of the sound presence judgment distribution, only that on the non-priority signal side may be generated, or those on both of the priority signal side and the non-priority signal side may be generated in the same manner as described earlier.

By incorporating the limiter 28 therein, the upper limit value of the phase adjusting amount relating to the priority operation can be limited, thereby making it possible to reduce the unnatural feeling of sound and consequently to improve the sound quality of the mixed output.

(c) Specific Example 3

As explained in specific examples 1 and 2, by using the sound presence judgment distribution $Q[i, k]$, it is possible to select either the priority output or the simple addition output depending on whether or not a sound is present on the time-frequency plane and consequently to obtain a mixed output having more natural and better sound quality.

However, in the sound presence judgment distribution $Q[i, k]$, in some cases, domains to be determined as presence of sound tend to form a large lump on the time-frequency plane. If the phase adjustment is carried out based upon the entire portion of this large lump, the result would become the same as that obtained without carrying out the sound presence judgment distribution, causing great degradation in the adjusted signals.

Therefore, on the time-frequency plane, energy of signal data of the target coordinates is compared with energy of each of signal data corresponding to coordinates adjacent to two sides thereof on the frequency axis. Then, by retrieving a domain where more energy is concentrated, it becomes possible to select a domain that is further limited in comparison with the sound presence judgment distribution. By carrying out operations on the amplitude and phase centered on this domain, it becomes possible to realize a smart mixer that is less susceptible to degradation of sound quality.

Supposing that the above-mentioned domain is a peak judgment distribution $P[i, k]$, the $P[i, k]$ is indicated by the following formula, with signal data on the time-frequency plane being set to $X[i, k]$ in the same manner as described above.

[Formula 18]

$$P[i, k] = \begin{cases} 1 & (|X[i, k-1]| < |X[i, k]| \text{ and } |X[i, k+1]| < |X[i, k]|) \\ 0 & (\text{except for the above}) \end{cases} \quad (18)$$

Upon generating the peak judgment distribution $P[i, k]$, it is possible to use not the amplitude of the above-mentioned signal data, but a phase change in the signal data. In the case when the short-time FFT is carried out as the frequency conversion to be carried out on the time-frequency conversion units 11a and 11b, suppose that a frame shift point number is represented by $N_{SFT}$ and that an FFT point number is represented by $N_{FFT}$. Supposing that signal data include a component having an energy center on a frequency bin number k, a phase change corresponding to $2\pi k N_{SFT}/N_{FFT}$ is generated between time $i-1$ and time $i$ with respect to this component. Then, a difference $\phi_1[i, k]$ in phase change is generally represented by the following formula.

[Formula 19]

$$\phi_1[i,k] = \phi[i,k] - \phi[i-1,k] - 2\pi k N_{SFT}/N_{FFT} \quad (19)$$

In this case, when a component having an energy center at the frequency bin number k is present, $\phi_1[i, k]=0$ holds. In the case when the energy center is located at a position lower than the frequency bin number k, $\phi_1[i, k]<0$ holds, and in the case when the energy center is located at a position higher than the frequency bin number k, $\phi_1[i, k]>0$ holds. Based upon the above description, the peak judgment distribution $P[i, k]$ is represented by the following formula.

[Formula 20]

$$P[i, k] = \begin{cases} 1 & (\Phi_1[i, k] < 0 \text{ and } \Phi_1[i, k-1] \geq 0) \\ 0 & (\text{except for the above}) \end{cases} \quad (20)$$

Upon generating the peak judgment distribution $P[i, k]$, a method based upon the amplitude of the signal data may be used, or a method based upon the phase of the signal data may be used, or both of these may be used.

Additionally, on the time-frequency plane, in the case when the above-mentioned peak judgment distribution is generated on a portion of a signal having no harmonic wave structure or a portion having a spectrum structure similar to that of white noise, the peak is detected with highly sensitively to sometimes cause an undesirable state. This state is caused in the same manner in both of the cases when the peak judgment distribution $P[i, k]$ is generated based upon the amplitude of signal and when it is generated based upon the phase. Therefore, this undesirable peak detection can be screened by using the following method.

Relative to the peak judgment distribution P[i, k] based upon the amplitude, a dip judgment distribution D[i, k] based upon the amplitude is defined by the following formula.

[Formula 21]

$$D[i, k] = \begin{cases} 1 & (|X[i, k-1]| > |X[i, k]| \text{ and } |X[i, k+1]| > |X[i, k]|) \\ 0 & (\text{except for the above}) \end{cases} \quad (21)$$

Suppose that with respect to coordinates (i, k), there is a domain $U_D$ on the time-frequency plane, which has a width $V_D$ in the future direction on the time axis and a width $V_D$ in the past direction thereon, and also has a width $W_D$ in the direction of high frequency on the frequency axis and a width $W_D$ in the direction of low frequency thereon. In the same manner, suppose that with respect to coordinates (i, k), there is a domain $U_P$ on the time-frequency plane, which has a width $V_P$ in the future direction on the time axis and a width $V_P$ in the past direction thereon, and also has a width $W_P$ in the direction of high frequency on the frequency axis and a width $W_P$ in the direction of low frequency thereon. Moreover, when no coordinates forming D[i, k]=1 are present within the domain $U_D$, with coordinates forming P[i, k]=1 being present within the domain $U_P$ by the number of 0.8 (2$V_P$+1) or more, this state is defined as a condition for adapting the peak judgment distribution P [i, k]. With this arrangement, it is possible to exclude undesirable peak detections. It is needless to say that with respect to this condition, not limited to the above-mentioned condition, any condition may be desirably set.

In the case of the peak judgment distribution P[i, k] based upon the phase, the dip judgment distribution D[i, k] is also defined based upon the phase.

[Formula 22]

$$D[i, k] = \begin{cases} 1 & (\Phi_1[i, k] \geq 0 \text{ and } \Phi_1[i, k-1] < 0) \\ 0 & (\text{except for the above}) \end{cases} \quad (22)$$

In this manner, in the same manner as in the case based upon the amplitude, the peak judgment distribution can be screened.

Additionally, regardless of the presence or absence of the execution of this screening, a point to be determined as a peak on the time-frequency plane is very hardly present. Therefore, points within a neighborhood region to the peak judgment point may be subjected to a peak judgment by a morphologic operation as indicated by the following formula (23).

[Formula 23]

$$P[i, k] = \begin{cases} 1 & (P[i, k] = 1 \text{ is present within a neighborhood region } U) \\ 0 & (\text{except for the above}) \end{cases} \quad (23)$$

It is needless to say that the neighborhood region U can be desirably set.

Figure 6:
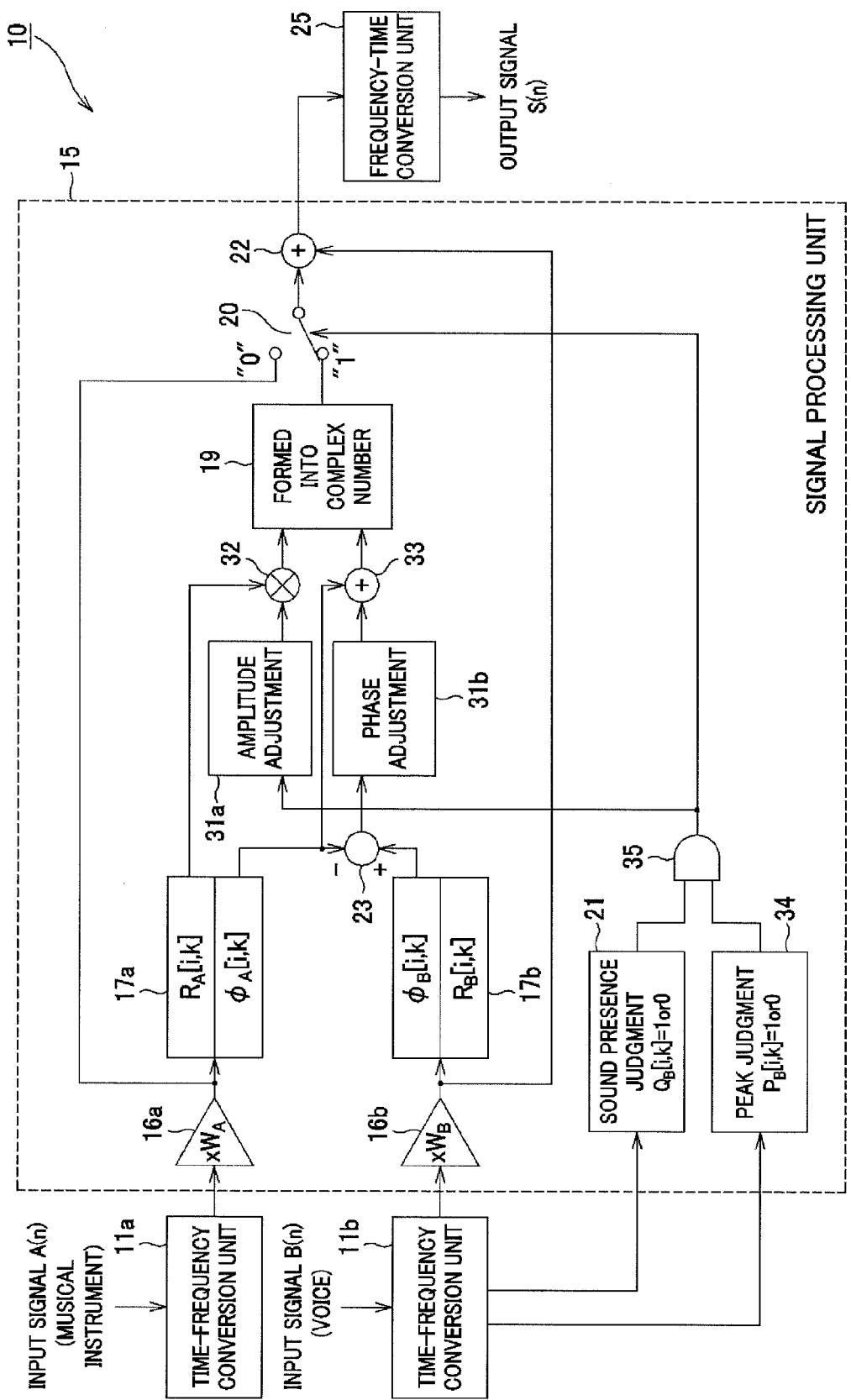
FIG. 6 is a block diagram showing a structural example of the mixing device of one or more embodiments of the present invention, which includes a configuration for use in smoothly changing an amplitude adjusting amount and a phase adjusting amount of signal data on a time-frequency plane upon carrying out a priority operation, and a configuration in which by generating a sound presence judgment distribution and a peak judgment distribution based upon signal data of a priority signal, a mixed output is controlled based upon the sound presence judgment distribution and the peak judgment distribution thus generated.

FIG. 6 is a block diagram of a structural example of a smart mixer to which the sound presence judgment and peak judgment functions are applied.

In the same manner as in FIGS. 3 to 5, the mixing device 10 shown in FIG. 6 has its input signal A(n) set as a non-priority signal and its input signal B(n) also set as a priority signal. The sound presence judgment unit 21 generates the sound presence judgment distribution $Q_B$ [i, k] explained in detail by the above-mentioned specific example, and the peak judgment unit (signal characteristic judgment unit) 34 generates the above-mentioned peak judgment distribution $P_B$[i, k]. Then, supposing that a logical product of the sound presence judgment distribution $Q_B$[i, k] and the peak judgment distribution $P_B$[i, k] is $PQ_B$[i, k], the $PQ_B$[i, k] is represented by the following formula.

[Formula 24]

$$PQ_B[i, k] = \begin{cases} 1 & (P_B[i, k] = 1 \text{ and } Q_B[i, k] = 1) \\ 0 & (\text{except for the above}) \end{cases} \quad (24)$$

It is supposed that only in the case when $PQ_B$[i, k]=1, the priority operation for carrying out the adjustment of the amplitude and phase of signal data is executed and the result thereof is outputted, and in the other cases, such a controlling process as to execute a simple adding operation is carried out.

The two input signals A(n) and B(n) in the time domain are respectively inputted to the time-frequency conversion units 11a and 11b. The input signals thus inputted are converted into signals in the frequency domain by a short-time FFT method in the time-frequency conversion units 11a and 11b so that signal data $X_A$[i, k] and $X_B$[i, k] are generated on the time-frequency plane composed of the time-axis and the frequency-axis. The signal data $X_A$[i, k] and $X_B$[i, k] are respectively inputted to coefficient units 16a and 16b inside the signal processing unit 15. The coefficient units 16a and 16b respectively multiply the inputted signal data $X_A$[i, k] and $X_B$[i, k] by $W_A$ times and $W_B$ times. The coefficient units 16a and 16b are respectively connected to amplitude/phase operation units 17a and 17b. The amplitude/phase operation units 17a and 17b calculate the amplitudes and phases of the signal data $X_A$[i, k] and $X_B$[i, k] in a different manner respectively. The output of a priority operation judgment unit 35 to be described later is inputted to an amplitude adjusting unit 31a. A finite difference between the phase $\phi_A$[i, k] on the input signal A(n) side and the phase $\phi_B$[i, k] on the input signal B(n) side is found by the adder-subtracter 23, and the result is inputted to a phase adjusting unit 31b.

In the amplitude adjusting unit 31a and the phase adjusting unit 31b, such an iteration operation as to smoothly connect mutual amplitudes and mutual phases at adjacent coordinates on the time-frequency plane is carried out so as to prevent degradation of sound quality due to an abrupt operation applied to the amplitudes and phases.

The following description will discuss the phase adjustment more specifically. The phase adjusting amount δ[i, k] at coordinates (i, k) on the time-frequency plane is pulled by a force exerted so as to be smoothly connected to the value of the adjacent phase adjusting amount δ[i, k] around the coordinates (i, k), and at coordinates (i, k) forming $PQ_B$[i, k]=1, it is also pulled by a force exerted so as to be attracted to a phase difference $\phi_0$[i, k] between the phase $\phi_A$[i, k] relative to the input signal A(n) and the phase $\phi_B$[i, k] relative to the input signal B(n). By carrying out iteration operations of several to several hundred times on the entire time-frequency plane, it is possible to calculate an appropriate phase adjusting amount δ[i, k]. Supposing that the phase adjusting amount at the n-th time of the iteration operations is δ[i, k]$^{(n)}$ and that the initial value is set to δ[i, k]$^{(0)}$=0, the δ[i, k]$^{(n+1)}$ can be found from the δ[i, k]$^{(n)}$ from the following updating rule.

[Formula 25]

$$\delta[i,k]^{(n+1)} = \delta[i,k]^{(n)} + \varepsilon\lambda PQ_B[i,k]f(\phi_0[i,k] - \delta[i,k]^{(n)}, \pi C_P, E_P) + \quad (25)$$
$$\varepsilon f(\delta[i, k-1]^{(n)} - \delta[i,k]^{(n)}, \pi C_F, E_F) +$$
$$\varepsilon f(\delta[i, k+1]^{(n)} - \delta[i,k]^{(n)}, \pi C_F, E_F) +$$
$$\varepsilon f(\delta[i-1, k]^{(n)} - \delta[i,k]^{(n)}, \pi C_T, E_T) +$$
$$\varepsilon f(\delta[i+1, k]^{(n)} - \delta[i,k]^{(n)}, \pi C_T, E_T)$$

In this case, ε represents a learning rate, which is adjusted in accordance with the number of iterations. Moreover, λ is a constant for use in finding a balance between the pulling force by $\phi_0$[i, k] and a force for use in smoothing the δ[i, k]=0 on the time-frequency plane. Here, $C_P$, $C_F$, $C_T$, $E_P$, $E_F$ and $E_T$ are also constants, and a non-linear function f is represented by the following formula.

[Equation 26]

$$f(\Delta, C, E) = \begin{cases} -\pi & (\Delta < -C) \\ -\pi(-\Delta/C)^E & (-C \leq \Delta < 0) \\ \pi(\Delta/C)^E & (0 \leq \Delta < C) \\ \pi & (C \leq \Delta) \end{cases} \quad (26)$$

With this arrangement, the final δ[i, k] is converged to a value by which all the forces are balanced.

In the amplitude adjusting unit 31a also, the amplitude adjusting amount can be smoothly connected in the same manner as described above.

In the amplitude adjusting unit 31a, the adjusted amplitude and the amplitude $R_A$[i, k] of the original signal data are multiplied by using a multiplier 32. In the phase adjusting unit 31b, the adjusted phase and the original $\phi_A$[i, k] are added to each other by using an adder 33. The amplitude multiplied by the multiplier 32 and the phase added by the adder 33 are inputted to the complex number operation unit 19, and the result of the priority operation is outputted. In the case when a judgment is made as $PQ_B$[i, k]=1 by the priority operation judgment unit 35, the result of the above-mentioned priority operation is outputted through the priority operation control unit 20, and is added to the output of the coefficient unit 16b by the adder 22 so that the resulting value is outputted to the frequency-time conversion unit 25.

The frequency-time conversion unit 25 executes an inverse FFT or the like, and a mixed output in the time domain is outputted. Additionally, in FIG. 6, both of the functions of the amplitude adjustment and the phase adjustment are incorporated; however, either one of these may be incorporated.

In the structural example of FIG. 6, the peak judgment unit and the sound presence judgment unit are used only on the priority signal side; however, these may be used only on the non-priority signal side, or may be used on both of the priority signal side and the non-priority signal side. Moreover, both of the peak judgment unit and the sound presence judgment unit have been used; however, only the peak judgment unit may be used, or the sound presence judgment unit and the peak judgment unit may be used in a mixed manner in which, for example, only the sound presence judgment unit is used on the input signal A(n) side, and the sound presence judgment unit and the peak judgment unit are used on the input signal B(n) side. Furthermore, these may be used in a mixed manner with a limiter mechanism as shown in FIG. 5. In specific example 1 shown in FIGS. 3 and 4 and specific example 2 shown in FIG. 5, the sound presence judgment unit may be substituted by a configuration in which, as shown in FIG. 6, the sound presence judgment unit 21, the peak judgment unit 34 and the priority operation judgment unit 35 are combined with one another, and switching may be made among the priority operations.

In the same manner as in the aforementioned specific example 1 or the like, parameters α, β, and the like for the priority operation may be desirably set, and adjusted. Moreover, with respect to the generation of the sound presence judgment distribution, the distribution may be generated only on the non-priority operation signal side, or may be generated on both of the priority and non-priority operation signal sides in the same manner as described above. The parameters and the like of the iteration operations may also be desirably set.

In addition to the functions of the sound presence judgment distribution, by introducing the functions of the peak judgment distribution, it becomes possible to realize switching processes between the priority operation and the simple adding operation in more finely adjusted manner, consequently to reduce the calculation loads, and further to realize a more natural mixed output. Moreover, by carrying out the amplitude adjustment and the phase adjustment, signal waveforms can be more smoothly connected, and a mixed output with higher sound quality can be achieved.

(d) Specific Example 4

In the examples explained in specific examples 1 to 3, upon executing priority operations, by making the phases of the priority signal and the non-priority signal coincident with each other as much as possible, the input signals are prevented from mutually interfering with each other. In contrast, by intentionally forming a very fine difference between the frequencies of the mutual input signals, it becomes possible to generate an appropriate buzzing sound, or by intentionally generating a difference with a fluctuation between the phases of the mutual input signals, it becomes possible to allow the sound to have a certain thickness or to form a natural sound while suppressing a feeling of an artificial sound; therefore, the following description will discuss structural examples of such a smart mixer.

Figure 7:
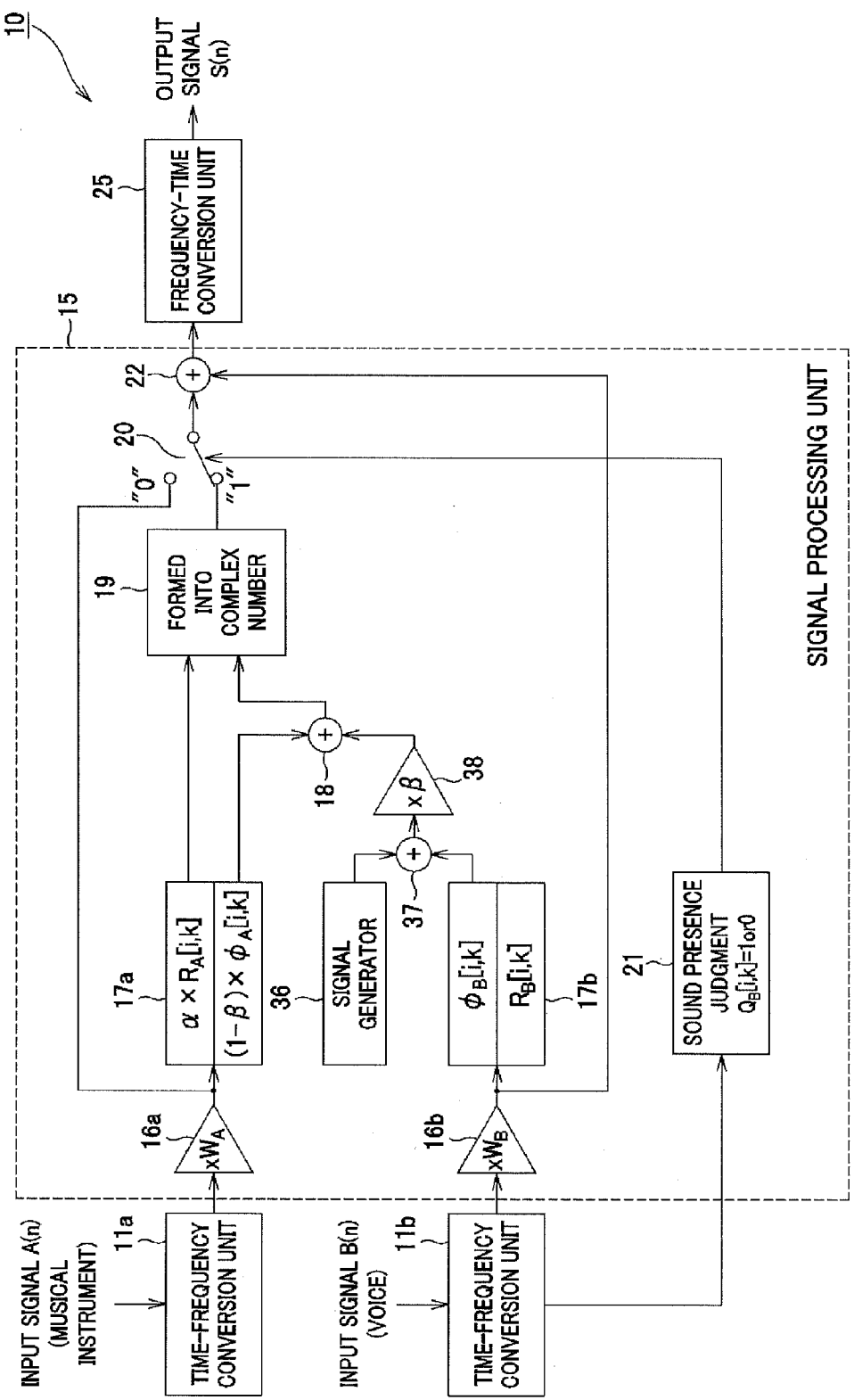
FIG. 7 is a block diagram showing a structural example of the mixing device of one or more embodiments of the present invention, which includes a configuration in which by adding an output of a signal generator to a phase of signal data of a priority signal so as to obtain audio effects such as a sound fluctuation or the like and a configuration in which by generating a sound presence judgment distribution base upon signal data of a priority signal, a mixed output is controlled based upon the sound presence judgment distribution thus generated.

FIG. 7 is a block diagram of a structural example of a smart mixer to which a signal generator, which is used for generating a fluctuation having the effects of allowing a sound to have a certain thickness and of forming a natural sound while suppressing a feeling of an artificial sound, is applied.

In the same manner as in those explained in specific examples 1 to 3, as shown in FIG. 7, the mixing device 10 sets the input signal A(n) as a non-priority signal and the input signal B(n) as a priority signal. To the structural example of the smart mixer described in specific example 1 and shown in FIG. 3, a signal generator 36 for use in generating a fluctuation in the phase $\phi_B$ of the signal data on the input signal B(n) side is further added. The signal of the signal generator 36 is added to the phase $\phi_B$ by an adder 37, and the phase thus added is multiplied by β times by using a coefficient unit 38. Then, the output of the coefficient unit 38 and the phase $\phi_A$ on the input signal A(n) side multiplied by (1−β) times are added to each other by the adder 18, and formed into a complex number by the complex number operation unit 19 so that a priority operation output is formed. Since the other configurations and operations are the same as those of the smart mixer explained in detail in specific example 1 and shown in FIG. 3, the explanations thereof will be omitted.

In the case when the signal generator 36 outputs a linear waveform having an inclination of K relative to the time, the input signal B(n) in FIG. 7 is provided with a frequency shift that is in proportion to K. Moreover, in the case when the signal generator 36 is realized as a chaotic signal generator or a random-number generator, it is possible to apply a pseudo-random fluctuation to the phase of the input signal B(n).

Moreover, the signal generated by the signal generator may be prepared not as an independent signal from the priority signal and non-priority signal, but as a signal to which information obtained from either one or both of the signals is added; thus, further effective effects can be obtained. For example, based upon rhythm information indicating what is the number of a certain music beat in a musical bar of music, the generated signal of the signal generator can be changed, or based upon information showing a composition of music, the generated signal of the signal generator can be changed so as to provide a sound with a certain thickness at a climax portion. In this manner, in addition to a process using musical information generated from the signal, meta-information except for the signal may be used. For example, by using document text data of sound signals, such a process may be provided in which in the case when a specific line appears, the BGM is greatly influenced by the line to give such a feeling as if the BGM was fluctuated.

It is needless to say that the signal generator can be introduced not only to the priority signal side, but also to the non-priority signal side. Moreover, the signal generator can also be introduced into a smart mixer forming the aforementioned specific example 2 or 3, or a modified example of these.

(e) Specific Example 5

In the above-mentioned specific examples 1 to 4, the priority operation is executed while using the signal data mainly as discrete data on the time-frequency plane; however, in the smart mixer, the signal data may be used as continuous data on the time-frequency plane. In order to use the signal data as continuous data on the time-frequency plane, the output of the time-frequency conversion unit is band-divided and formed into a time-wise waveform. The time-frequency conversion unit for outputting such a time-wise waveform having divided bands can be realized by carrying out the filter bank or the short-time FFT by using a single sample with a length based upon a frame-shift basis.

Suppose that a signal waveform at point of time n of a band pass filter (hereinafter, referred to also as BPF) having the k-th numbered pass band is represented by $X_A[n, k]$ and $X_B[n, k]$ as signal data on the time-frequency plane. Supposing that $X_A[n, k]$ forms a non-priority signal and $X_B[n, k]$ forms a priority signal, the priority operation in this case is realized by operating the time-axis to delay or proceed the phase of $X_A[n, k]$ in a manner so as to be coincident with the phase of $X_B[n, k]$. Then, by adding all the outputs of the band pass filters to one after another, a frequency-time conversion process is carried out and a mixed output that has been subjected to the priority operation can be obtained.

In the above-mentioned description, although the priority operation is executed by carrying out calculating processes on the phase of signal data, the priority operation may also be executed by carrying out calculating processes on the amplitude of signal data.

Figure 8:
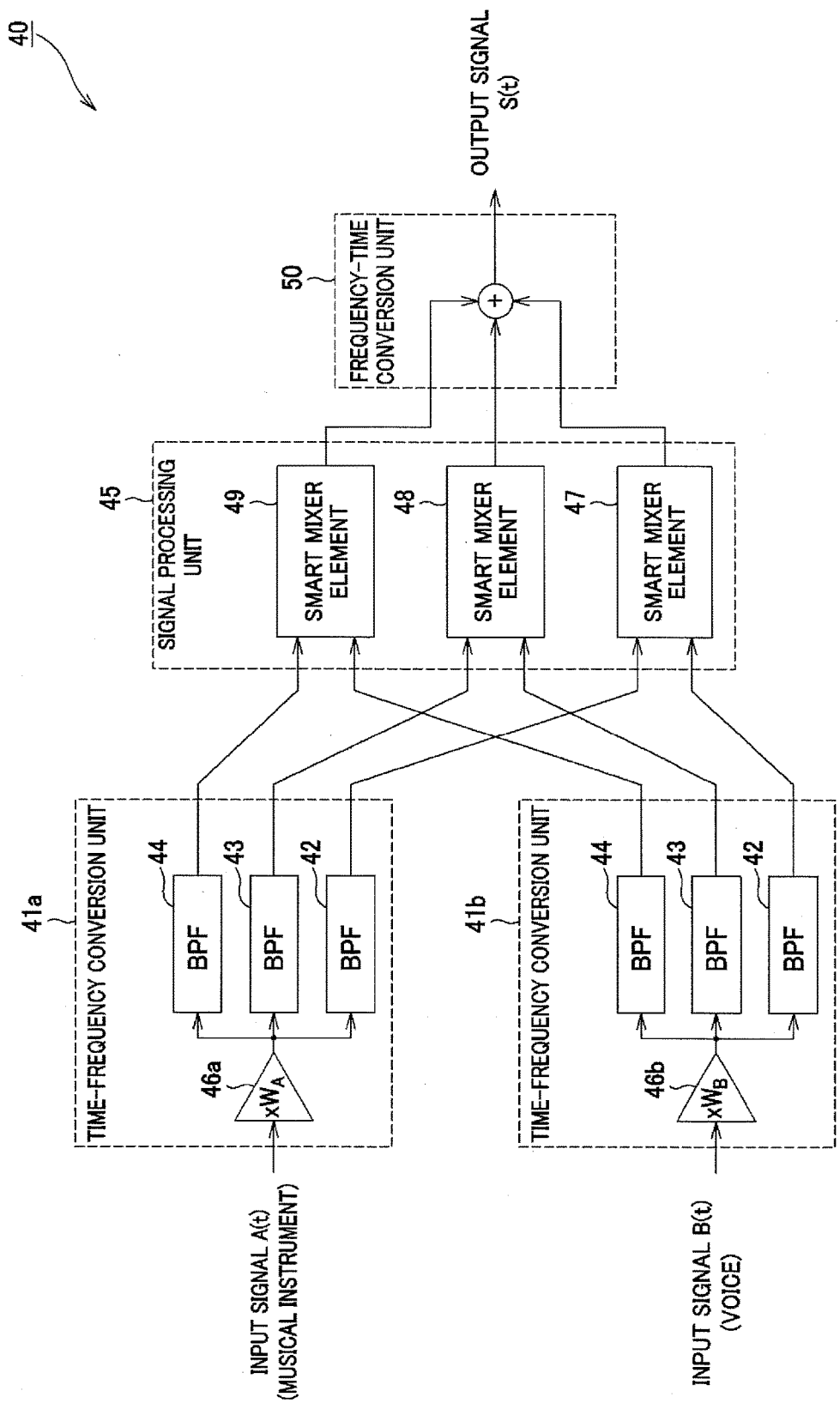
FIG. 8 is a block diagram showing a structural example of the mixing device of one or more embodiments of the present invention, which is used for generating a mixed output in an analog domain by using a filter bank and a smart mixer element.

FIG. 8 is a block diagram showing a smart mixer in which the priority operation is executed by using a smart mixer element that carries out a frequency conversion by using a filter bank and carries out an amplitude operation in an analog domain.

As shown in FIG. 8, in a mixing device 40, input signals A(t) and B(t) are respectively inputted to time-frequency conversion units 41a and 41b. The time-frequency conversion units 41a and 41b are filter banks composed of a large number of BPFs. The input signals A(t) and B(t) thus inputted are multiplied by $W_A$ times and $W_B$ times by respective coefficient units 46a and 46b using preliminarily set constants, and then inputted to the filter banks. Each of the filter banks, which is composed of a plurality of BPFs having different pass bands, includes a first BPF 42 having a first pass band, a second BPF 43 having a second band pass and a third BPF 44 having a third band pass. The number of the BPFs is not limited to three, and may of course be three or more, or three or less, depending on a desired frequency resolution. The number of the BPFs may be set in a range from 2 to 4096. The first BPFs 42 and 42 of the time-frequency conversion units 41a and 41b are the same BPFs, and the outputs thereof are respectively inputted to a first smart mixer element 47 of the signal processing unit 45. The outputs of the second BPF 43 and the third BPF 44 are also inputted to corresponding second smart mixer element 48 and third smart mixer element 49 inside the signal processing unit 45.

Figure 9:
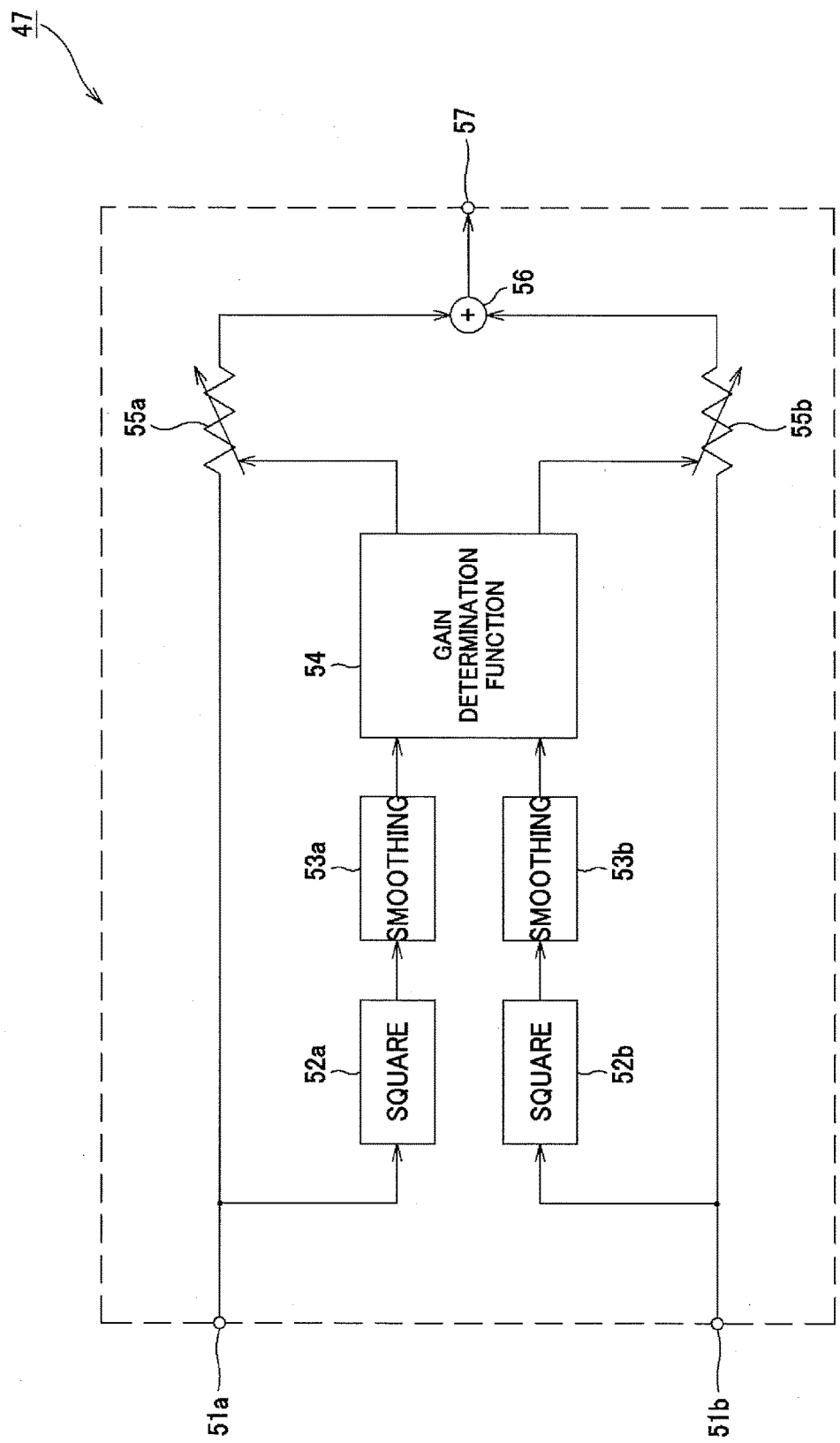
FIG. 9 is a block diagram showing a structural example of the smart mixer element in the mixing device of FIG. 8 according to one or more embodiments of the present invention, which includes a configuration for controlling an amplitude of each signal by calculating energy based upon an amplitude of an input signal upon carrying out a priority operation.

The first smart mixer element 47, the second smart mixer element 48 and the third smart mixer element 49 calculate energy of signal data in the respective frequency bands based upon their amplitudes, and compare the energy with a preliminarily set threshold value so as to adjust the amplitudes of the respective signal data. FIG. 9 is a block diagram showing a structural example of the first smart mixer element 47.

The outputs of the two first BPFs 42 are inputted to signal input units 51a and 51b of the first smart mixer element 47. The signal data thus inputted to the signal input units 51a and 51b have their amplitudes respectively controlled by variable coefficient units 55a and 55b, and are added to each other by an adder 56, and then transmitted to a signal output unit 57. The gains of the variable coefficient units 55a and 55b are controlled in accordance with energy calculated based upon the amplitudes of the inputted two signal data. Each of the two signal data is squared in each of the amplitude operation units 52a and 52b, and then smoothed by each of the energy operation units 53a and 53b; thus, each energy can be calculated. In this case, the amplitude operation units 52a and 52b are not limited by those carrying out a square operation as shown in FIG. 9, and may be those which carry out an absolute value operation; moreover, they are not limited by those carrying out calculations based upon an instantaneous value of the amplitude, and may be those which carry out calculations based upon instantaneous values during a predetermined period of time, or by taking an average of square values of them. Moreover, the energy operation units 53a and 53b can be realized by a well-known smoothing circuit, such as a first-order lag filter, a second-order lag filter or the like, composed of resistors, capacitors, coils and the like.

Figure 10A:
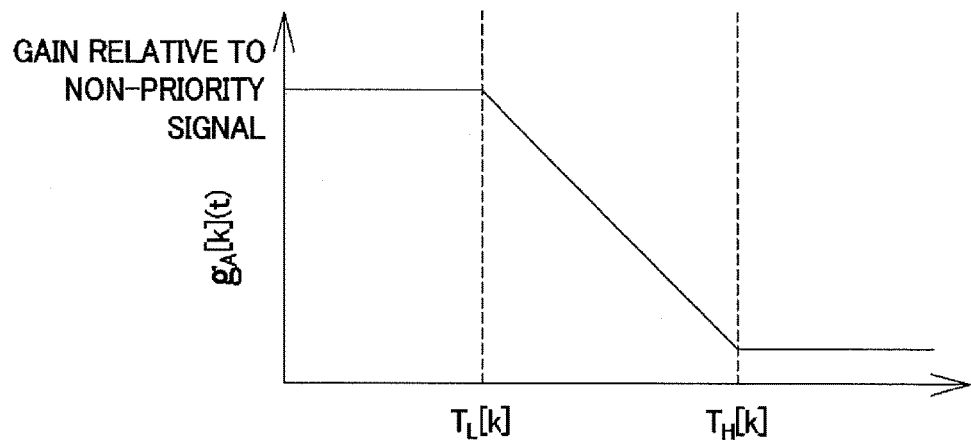
FIGS. 10A and 10B show characteristics of a gain determination function of the smart mixer element of FIG. 9 according to one or more embodiments of the present invention.
Figure 10B:
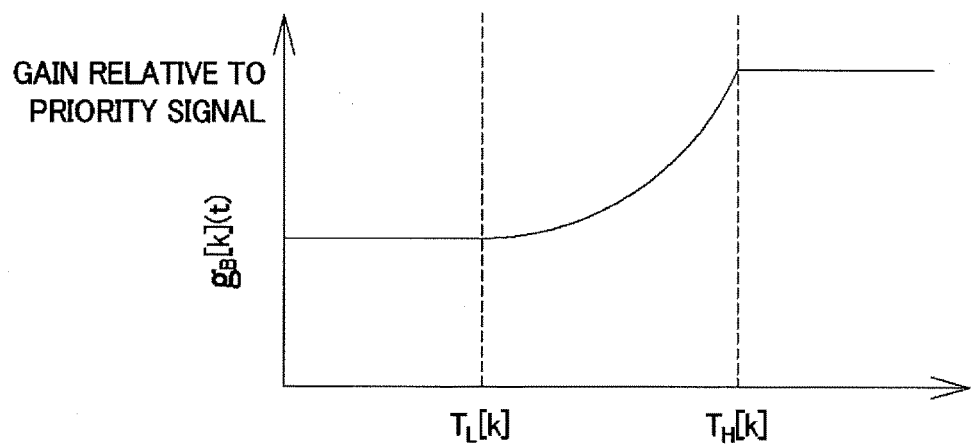

The energy thus calculated is used for determining a gain of the variable coefficient units 55a, 55b in the priority operation unit 54 based upon gain-energy characteristics as shown in FIG. 10. With respect to the k-th numbered BPF, a gain $g_A[k](t)$ corresponding to an input signal A(t) serving as a non-priority signal forms a constant value when energy $D_B[k](t)$ of an input signal B(t) set as a priority signal is a lower threshold value $T_L[k]$ or less as shown in FIG. 10(A), and is virtually linearly lowered when the energy $D_B[k](t)$ is located between the lower threshold value $T_L[k]$ and a higher threshold value $T_H[k]$. When the energy $D_B[k](t)$ becomes the upper threshold value $T_H[k]$ or more, the gain $g_A[k](t)$ forms a constant value in a low level. On the other hand, a gain $g_B[k](t)$ corresponding to the input signal B(t) serving as the priority signal forms a constant value when the energy $D_B[k](t)$ of the priority signal is a lower threshold value $T_L[k]$ or less as shown in FIG. 10(B), and gradually increases when it is located between the lower threshold value $T_L[k]$ and a higher threshold value $T_H[k]$. When the energy $D_B[k](t)$ becomes the upper threshold value $T_H[k]$ or more, the gain $g_B[k](t)$ forms a constant value in a high level. In this manner, in accordance with the energy $D_B[k](t)$ of the input signal B(t) that is the priority signal, the gain relative to signal data on the A(t) side and B(t) side is controlled.

Therefore, in the case when the energy $D_B[k](t)$ is the lower threshold value $T_L[k]$ or less, the priority signal is determined as corresponding to the soundless state explained in detail in specific example 1 or the like, and the non-priority signal, as it is, is outputted. In the case when the energy $D_B[k](t)$ is the upper threshold value $T_H[k]$ or more, this state is determined as the sound presence judgment state so that the gain on the non-priority signal side is suppressed. In the case when the energy $D_B[k](t)$ is located in a range from the lower threshold value $T_L[k]$ to the higher threshold value $T_H[k]$, the gain of the non-priority signal is reduced while the gain of the priority signal is increased in accordance with an increase of the energy $D_B[k](t)$. That is, a switching is gradually made from the soundless judgment to the sound presence judgment.

Additionally, with respect to a portion with the gain of the non-priority signal reduced, the sound volume feeling of the signal tends to become insufficient when a mixing process is carried thereon. Therefore, as shown in FIG. 10(B), by making a setting so as to increase an increasing rate of the gain as it comes closer to the threshold value $T_H[k]$ on the upper side, the sound volume is improved.

With respect to the gain-energy characteristics of the other smart mixer elements, all of them may be the same, or the threshold value may be changed for each of the corresponding frequency bands, or the gain may be changed. Moreover, it is needless to say that not limited to the above-mentioned characteristics, a desired characteristic may be selected.

With respect to the first and second smart mixer elements 48 and 49 respectively corresponding to the first and second BPFs 43 and 44, the same configurations as those described above may be used, and the same priority operation is executed.

The mixed outputs divided for the respective frequency bands are added by an adder serving as the frequency-time conversion unit 50 so that an output signal S(t) in the time domain is obtained.

Not limited to the above-mentioned amplitude adjustment independently carried out, both of the phase and amplitude adjustments may be carried out. Additionally, in the case of adjusting the phase, a continuous time system may be applied to the aforementioned specific examples 1 to 4.

By the operations of the priority operation unit of the above-mentioned smart mixer element, the output levels of the priority signal and the non-priority signal are continuously controlled so that the clearness of the priority signal can be smoothly increased.

(4) Actual Measurement Example

FIG. 11 shows actual measurement time waveforms of an input signal and a mixed output signal, and distributions on a time-frequency plane (hereinafter, referred to as "spectrogram"). FIGS. 11(A) to 11(E) show time-based waveforms, and FIGS. 11(F) to 11(J) show spectrograms. Suppose that an input signal A(n) is a non-priority signal and its sound source is an electric guitar (FIG. 11(A) and FIG. 11(F)). Suppose that an input signal B(n) is a priority signal and its sound source is a female voice (FIG. 11(B) and FIG. 11(G)). The scale of the amplitude of the input signal B(n) is smaller than that of the input signal A(n) by one decimal point. That is, the female voice has an extremely lower level than the volume of the electric guitar. FIGS. 11(C) and 11(H) show mixed outputs formed by simply adding the input signals A(n) and B(n) to each other. FIGS. 11(D) and 11(I) show mixed outputs obtained by a smart mixer of a structural example of FIG. 3 explained in the aforementioned specific example 1, which corresponds to a mixing machine configured based upon one or more embodiments of the present invention. FIGS. 11(E) and 11(J) show mixed outputs obtained by a smart mixer of a structural example of FIG. 6 explained in the aforementioned specific example 3. In this case, in the spectrograms, the sizes of the amplitude are indicated by changing colors. A setting is made such that the amplitude becomes greater in the order of white, gray and black (in the original document, a colored display is used, and the original document indicates that the amplitude becomes greater in the order of white, pink, red, orange, yellow, green, blue and black).

Table 1 shows the specification of the smart mixer from which the results of FIGS. 11(D) and 11(I) are obtained.

TABLE 1

| | | |
|---|---|---|
| Sampling frequency | $F_S$ | 44.1 kHz |
| Input signal A | A[n] | Electric guitar (Melody of tea-picking) |
| Input signal B | B[n] | Female voice (Saying "Senior, Can I walk with you up to that corner?") |
| FFT point | $N_{FFT}$ | 4096 points |
| Window function upon analysis | H[n] | Cosine function type 128 points + flat portion 255 points + cosine function type 128 points |
| Window function upon synthesis | G[n] | Hanning window type 255 points |
| Frame shift | $N_{SFT}$ | 64 points |
| Mixing parameter | α | 0.95 |
| Mixing parameter | β | 0.85 |
| Sound presence judgment (Time axis) | $m_1, m_2$ | $m_1 = m_2 = 3$ |
| Sound presence judgment (Frequency axis) | $n_1, n_2$ | $n_1 = n_2 = 4$ |

As shown in FIG. 11(F), although sound of the electric guitar of the input signal A has a spectrogram with a lateral striped pattern as a whole, the female voice of the input signal B forms a spectrogram with a curved line shape that depends on the intonation change of pronunciation as shown in FIG. 11(G). A spectrogram of an output formed by a conventional mixing process based upon a simple addition is shown in FIG. 11(H). This is almost the same as that of FIG.

11(F) except for a time section from 0.0 second to 0.5 seconds in which the electric guitar is in a soundless state. On the hearing sense, the input signal B derived from a female voice can be hardly heard. In contrast, it is found that, as shown in FIG. 11(I), in the mixed output of the smart mixer, during time sections from 1.6 seconds to 2.0 seconds and from 2.6 seconds to 3.0 seconds, the spectrogram having the curved line shape derived from the female voice is mixed. On the hearing sense, the female voice can be sufficiently heard. Moreover, when FIG. 11(H) and FIG. 11(I) are compared with each other, the spectrogram shapes during the time section from 0.0 second to 0.5 seconds are virtually the same, indicating that this is not the case that the volume of the female voice is simply raised so as to be easily heard.

Table 2 shows the specification of the smart mixer from which the results of FIGS. 11(E) and 11(J) are obtained. The input signals are the same as those of Table 1. Moreover, for the purpose of simplicity, $\alpha[i, k]$ is fixed as constant 1, and only the phase adjustment was carried out without carrying out the amplitude adjustment.

TABLE 2

| | | |
|---|---|---|
| Sampling frequency | $F_S$ | 44.1 kHz |
| Input signal A | A[n] | Electric guitar (Melody of tea-picking) |
| Input signal B | B[n] | Female voice (Saying "Senior, Can I walk with you up to that corner?") |
| FFT point | $N_{FFT}$ | 4096 points |
| Window function upon analysis | H[n] | Cosine function type 128 points + flat portion 255 points + cosine function type 128 points |
| Window function upon synthesis | G[n] | Hanning window type 255 points |
| Frame shift | $N_{SFT}$ | 64 points |
| Adjustment of amplitude | $\alpha[i, k]$ | 1 (For simplicity) |
| Sound presence judgment (time-axis) | $m_1, m_2$ | $m_1 = m_2 = 3$ |
| Sound presence judgment (frequency-axis) | $n_1, n_2$ | $n_1 = n_2 = 4$ |
| Frequency correction upon sound presence judgment | $G_{adj}$ | 12 dB/oct |
| Peak judgment (time-axis) | $V_P$ | 2 points |
| Peak judgment (frequency-axis) | $W_P$ | 4 points |
| Dip judgment (time-axis) | $V_D$ | 2 points |
| Dip judgment (frequency-axis) | $W_D$ | 2 points |
| Peak expansion (time-axis) | V | 4 points |
| Peak expansion (frequency-axis) | W | 4 points |
| Non-linear function parameter | $C_T$ | 0.10 |
| Non-linear function parameter | $C_K$ | 0.10 |
| Non-linear function parameter | $C_P$ | 0.25 |
| Non-linear function parameter | $E_T$ | 3.0 |
| Non-linear function parameter | $E_K$ | 3.0 |
| Non-linear function parameter | $E_P$ | 1.0 |
| Iteration number | $N_{it}$ | 100 times |
| Iteration gain | $\epsilon$ | 0.2 |
| Force balance | $\lambda$ | 10.0 |

When FIG. 11(I) and FIG. 11(J) are compared with each other, the decay of the shape of the spectrogram of the electric guitar in FIG. 11(J) is less than that of FIG. 11(I). On the hearing sense as well, in the case of FIG. 11(I), a slight distortion occurs in the time section from 1.6 seconds to 2.0 seconds; however, it can be recognized on the hearing sense that in the case of FIG. 11(J), the distortion in the same time section is reduced.

2. Mixing Signal Processing Device

As shown in FIG. 1, the mixing signal processing device according to one or more embodiments of the present invention is provided with a signal processing unit 15 to which signal data on the time-frequency plane shown in FIG. 2 is inputted so as to carry out a mixing process on the time-frequency plane. To the signal processing unit 15, signal data generated by frequency-converting two input signals in the time domain by time-frequency conversion units 11a and 11b are inputted. A mixing signal in the frequency domain generated by the signal processing unit 15 is converted into a signal in the time domain by the frequency-time conversion unit 25, and outputted as an output signal. The mixing signal processing device is operated in accordance with the aforementioned operation principle of the mixing device. Since the detailed explanation thereof is overlapped with the aforementioned explanation, it will be omitted in the following description.

Moreover, the mixing signal processing device according to one or more embodiments of the present invention may be provided with the signal processing unit 15 shown in FIG. 3 and explained in the aforementioned specific example 1. Furthermore, it may also be provided with the signal processing units 15 and 45 shown in FIGS. 4 to 8 and explained in specific examples 2 to 5. Since the detailed configurations and operations thereof are the same as those explained earlier, the detailed explanation thereof will be omitted.

3. Mixing Program

In one or more embodiments of the present invention, a mixing program is proposed in which two or more input signals are mixed with one another so as to allow a computer to output the resulting output signal. This mixing program is installed from a recording medium such as a CD-ROM or the like in a storage device such as a hard disk or the like of this computer. Alternatively, the mixing program may be downloaded into the computer from a storage device of a server connected thereto via a network, such as the Internet or the like, and installed therein.

The mixing program in accordance with one or more embodiments of the present invention has a step of converting two or more input signals in the time domain into signals in the frequency domain so that signal data on the time-frequency plane composed of the time-axis and the frequency-axis is generated. It also has another step in which by operating the signal data on the time-frequency plane, a mixing process is carried out on the time-frequency plane to generate mixed data. It also has still another step of converting the mixed data thus generated into a signal in the time domain so that the resulting output signal is outputted. In this case, at least one of the two or more input signals is a priority signal to which more priority is given in comparison with the other input signals so as to improve the degree of clearness, and the rests of the input signals are prepared as non-priority signals. Moreover, the step of generating the mixed data includes a step of executing such a priority operation as to improve the degree of clearness by preferentially carrying out the operation on the priority signal rather than on the non-priority signal, which is carried out on any one of the phase, amount of delay, amplitude, and a combination of these of the respective signal data on the time-frequency plane generated by the step of generating the signal data. These priority operations include operations for increasing the amplitude of the priority signal and for reducing the amplitude of the non-priority signal so that the phase of the non-priority signal is delayed or proceeded relative to the phase of the priority signal, or the phase of the priority signal is delayed or proceeded relative to the phase of non-priority signal, or the combination of these is carried out so as to make the phase of the non-priority signal and the phase of the priority signal coincident with each other. The above-mentioned operations are executed by a computer as a program that is developed on the computer memory.

Figure 12:
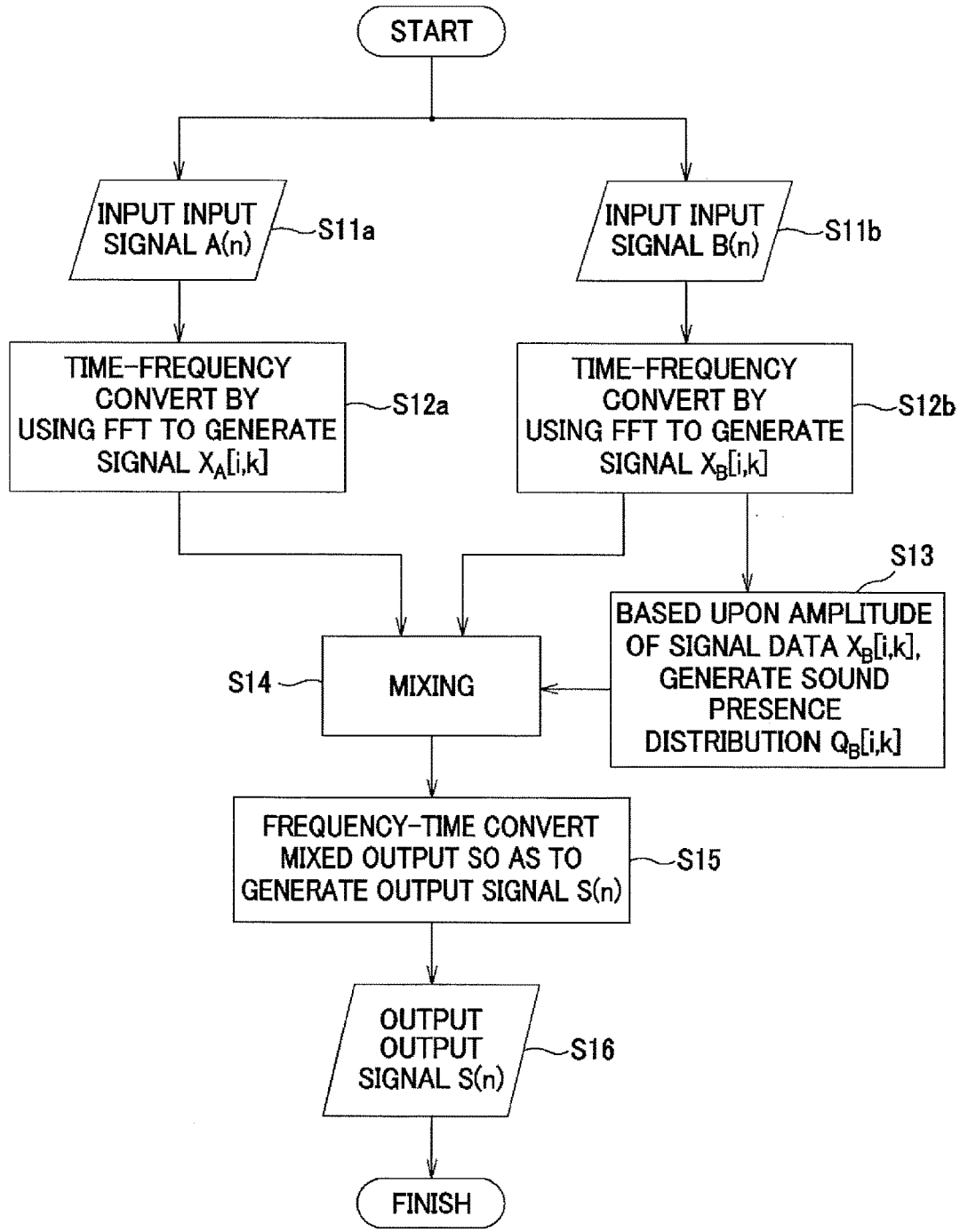
FIG. 12 shows an example of a flowchart for use in explaining a mixing program and a mixing method of one or more embodiments of the present invention, which generate a sound presence judgment distribution based upon signal data of a priority signal and control a priority operation based upon the sound presence judgment distribution so that a mixing process is carried out.

More specifically, as shown in FIG. 12, in steps S11a and S11b, input signals A(n) and B(n) are respectively inputted to the two time-frequency conversion units 11a and 11b. Upon inputting the input signals, a real-time inputting process, for example, through a microphone or the like may be carried out, or data stored in a storage medium may be inputted. Moreover, packet data may be inputted. Suppose that the input signal A(n) is a non-priority signal and the input signal B(n) is a priority signal.

In steps S12a and S12b, by using the short-time FFT, short-time Fourier transform, wavelet transform, the transform by a filter bank, or another conversion method into the time-frequency distribution, steps for converting a signal in the time domain to a signal in the frequency domain are carried out. Additionally, with respect to the conversion method of a signal in the time domain into a signal in the frequency domain, a method for carrying out component decompositions including frequency information, such as generalized harmonic analyses, sinusodial wave decomposition, sparse decomposition, or the like, may be used, or not limited to the above-mentioned methods, other conventionally known techniques or methods may be used in the same manner as described earlier.

A priority operation is executed on signal data $X_A[i, k]$ and $X_B[i, k]$ thus generated on the time-frequency plane. The priority operation refers to an operation for use in adjusting the amplitude and phase of the signal data on the time-frequency plane described in detail in specific examples 1 to 6, and in order to increase the degree of clearness of the priority signal, this operation is used for adjusting the amplitude and phase of the priority signal and/or the non-priority signal so as to prevent the priority signal from being interrupted by the non-priority signal. In step S14, after carrying out the priority operation thereon, the signal data $X_A[i, k]$ and $X_B[i, k]$ are added to each other so that a mixing process for obtaining a mixed output is executed.

In step S13, based upon the amplitude of the signal data $X_B[i, k]$ serving as the priority signal, a sound presence judgment distribution $Q_B[i, k]$ is generated. Additionally, since the method for generating the sound presence judgment distribution $Q_B[i, k]$ is the same as that described earlier, the overlapped explanation in detail will be omitted.

In step S14, upon judging that sound is present based upon the sound presence judgment distribution $Q_B[i, k]$ generated in step S13, that is, in the case when $Q_B[i, k]=1$, the result from the priority operation is used as the mixed output, while in the case when $Q_B[i, k]=0$, the result of a simple addition is used as the mixed output.

In step S15, a signal $X_S[i, k]$ in the frequency domain given as the mixed output is converted to a signal in the time domain, and in step S16, this is outputted as an output signal S(n). The output signal S(n) may be connected to a speaker, an amplifier, or the like, and outputted in real time as the mixed output, or may be stored in a storage medium so as to be reproduced separately, or may be further processed or the like.

Upon executing the priority operation, by calculating the adjusting amounts of the amplitude and the phase of signal data adjacent to each other on the time-frequency plane, the amount of change in the amplitude and the phase of the signal data can be smoothed so that degradation of sound quality due to forceful operation processes of the amplitude and the phase can be suppressed. For this purpose, as described in specific example 3, the sound presence judgment distribution $Q_B[i, k]$ and the peak judgment distribution $P_B[i, k]$ may be used.

Figure 13:
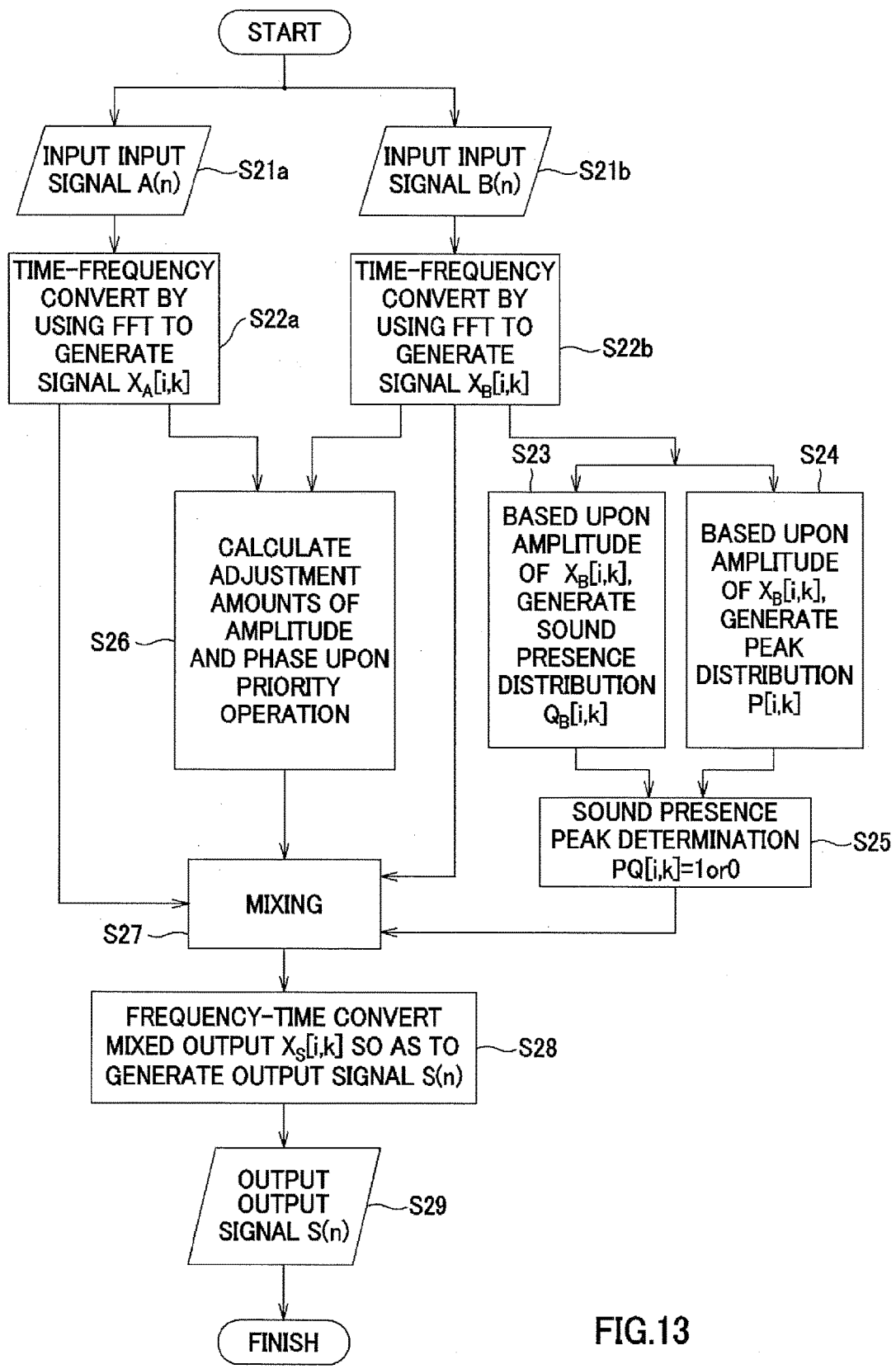
FIG. 13 shows an example of a flowchart for use in explaining a mixing program and a mixing method of one or more embodiments of the present invention in which upon carrying out a priority operation, amplitude and phase adjusting amounts of signal data are calculated so as to smoothly change these so that a sound presence judgment distribution and a peak judgment distribution are generated based upon signal data of a priority signal, thereby controlling the priority operation so as to carry out a mixing process.

As shown in FIG. 13, in steps S21a and S21b, the input signal A(n) set as the non-priority signal and the input signal B(n) set as the priority signal are respectively inputted to the time-frequency conversion units 11a and 11b. In step S22a and step S22b, the input signals A(n) and B(n) thus inputted are frequency-converted by using a short-time FFT or the like by the time-frequency conversion units 11a and 11b so that signal data $X_A[i, k]$ and $X_B[i, k]$ on the time-frequency plane are generated.

In step S26, based upon the signal data $X_A[i, k]$ and $X_B[i, k]$ generated in steps S22a and S22b, the adjusting amounts of the amplitude and the phase at the time of the priority operation are calculated, and in step S27, a mixing process is carried out.

In this case, in step S23, a sound presence judgment distribution $Q_B[i, k]$ is generated based upon the amplitude of signal data in the neighborhood of coordinates (i, k) of $X_B[i, k]$ corresponding to the priority signal.

In step S24, a peak judgment distribution $P_B[i, k]$ is generated based upon the amplitude of signal data adjacent to the coordinates (i, k).

In step S25, a logical product $PQ_B[i, k]$ of $Q_B[i, k]$ and $P_B[i, k]$ is generated in the signal processing unit 15 so that a sound peak judgment is carried out.

In step S27, in the case when the sound peak judgment distribution $PQ_B[i, k]=1$, the result of the priority operation is outputted and mixed, and in the case when $PQ_B[i, k]=0$, a simple addition is used for carrying out the mixing process.

In step S28, the mixed output $X_S[i, k]$ in the frequency domain is converted to a signal in the time domain, and in step S29, the output signal S(n) converted to a signal in the time domain is outputted.

In the case of an example shown in FIG. 12 in which switching is made between the priority operation and the simple addition based upon the sound presence judgment distribution of the priority signal, the mixing program is not necessarily limited to carrying out the switching between the priority operation and the simple addition based upon the sound presence judgment distribution and the peak judgment distribution of the priority signal. The mixing program is not necessarily limited to carry out the switching between the priority operation and the simple addition based upon the sound presence judgment distribution and the peak judgment distribution of the non-priority signal. The switching between the priority operation and the simple addition may be carried out based upon the sound presence judgment distribution and the peak judgment distribution of the non-priority signal, or may be carried out based upon the sound presence judgment distribution and the peak judgment distribution of both of the priority signal and the non-priority signal. Only the peak judgment distribution may be used without using the sound presence judgment distribution. Moreover, in place of step S26 shown in FIG. 13, the limiter function of the phase adjusting amount as explained in detail in specific example 2 may be used. The step for use in adding a signal for generating the fluctuation effect explained in detailed in specific example 4 may be added after the generation of the signal data on the time-frequency plane. The signal data on which the priority operation is executed may be discrete data or continuous data.

By executing the mixing program on a computer, it becomes possible to easily obtain a mixed output having improved sound quality with a high degree of clearness for the signal selected as the priority signal.

4. Mixing Method

As still another aspect of the present invention, a mixing method is proposed in which two or more input signals are mixed so as to output an output signal.

The mixing method relating to one or more embodiments the present invention has a step of converting two or more input signals in the time domain into signals in the frequency domain by the time-frequency conversion unit and of generating signal data on the time-frequency plane composed of the time-axis and the frequency-axis. It further has a step in which by operating the signal data on the time-frequency plane in the signal processing unit, a mixing process is carried out on the time-frequency plane so as to generate mixed data. It also has a step of converting the mixed data thus generated into a signal in the time domain by using the frequency-time conversion unit, and of outputting the resulting output signal. In this case, at least one of the two or more signals is a priority signal to which more priority is given in comparison with the other input signals so as to improve the degree of clearness, and the rests of the input signals are prepared as non-priority signals. Then, the step of generating the mixed data is further provided with a step of executing such a priority operation as to improve the clearness by preferentially carrying out the operation on the priority signal rather than on the non-priority signal, which is carried out on any one of the phase, amount of delay, amplitude, and a combination of these of the respective signal data on the time-frequency plane generated by the step of generating the signal data. These priority operations include operations for increasing the amplitude of the priority signal and for reducing the amplitude of the non-priority signal so that the phase of the non-priority signal is delayed or proceeded relative to the phase of the priority signal, or the phase of the priority signal is delayed or proceeded relative to the phase of non-priority signal, or the combination of these is carried out so as to make the phase of the non-priority signal and the phase of the priority signal coincident with each other.

More specifically, steps as shown in FIGS. 12 and 13 are provided, and since these steps are the same as those of the aforementioned mixing program, the detailed description thereof will be omitted.

5. Others, Applications, Etc.

As described above, in according to one or more embodiments of the present invention, it is possible to improve the degree of clearness of the priority signal and consequently to obtain a desirable mixed output while preventing the priority signal from being buried with the non-priority signal. In any of the priority signal and the non-priority signal, it is possible to make a waveform distortion hardly generated and consequently to improve the sound quality.

One or more embodiments of the present invention are not only used for a mixing console for use in a studio, but also utilized for various applications described below.

For example, one or more embodiments of the present invention may be used for an audio system inside an automobile. That is, by using the mixing device of one or more embodiments of the present invention, even when, while a person in an automobile is listening to music, a guiding voice of car navigation is mixed therein, the guiding voice can be heard without interruption in the music.

By using the mixing device of one or more embodiments of the present invention for a television receiver, even when a warning sound, such as an emergency earthquake message, is mixed in a program voice, the TV viewer is allowed to hear the warning sound without interruption in the program voice. The same effect can be obtained in the case of mixing processes in a broadcast station.

In the broadcasting site of a radio broadcasting station or the like, the mixing device according to one or more embodiments of the present invention may be used, and for example, a DJ voice can be mixed in a theme song of a program with high degree of clearness.

Upon mixing some of a large number of sound sources in a personal computer, the mixing device according to one or more embodiments of the present invention may be used. For example, in a video editing job, when many sounds, such as a voice of a video recorder, a warning sound of an editor, a mail arriving sound, and the like, are outputted from a single speaker, mixing processes can be carried out, while preventing respective sounds from being mutually interrupted with one another.

By applying one or more embodiments of the present invention to a karaoke device, a singing voice can be overlapped with an accompanying melody with a special sound effect, and at the time of a duet song, it is possible to mix two persons' singing voices pleasantly in harmony with each other.

By applying one or more embodiments of the present invention to a mobile telephone, even when many persons are talking, by increasing the degree of clearness of a specific person, the voice of the person can be made conspicuous.

By applying one or more embodiments of the present invention to a conference system using the Internet, even when there are simultaneous speakers, only the voice of a specific person, for example, the presenter, can be made conspicuous.

Moreover, in the case when not limited to mixing of a voice and a melody (musical instrument sound, BGM), musical instrument sounds are mutually mixed with each other, the technique of one or more embodiments of the present invention can be used for a process for giving priority over a musical instrument sound playing an essential part, such as a melody or the like.

In addition to these, it can also be used as a plug-in, or the like, for another voice processing program or software.

The mixing device, mixing signal processing device, mixing program and mixing method as described above are exemplary only, and the present invention is not intended to be limited only by the above-mentioned embodiments, and it is needless to say that various modifications may be made therein within a scope not departing from the gist of the present invention.

In one or more of the above-mentioned embodiments, signals in the time domain are used as the input signals A(n) and B(n); however, signals of another mode may be used as long as they are signals derived from signals in the time domain. For example, signals, such as compression encoded signals of the MP3 system, which are encoded in the time domain and the frequency domain, may be used.

Figure 14:
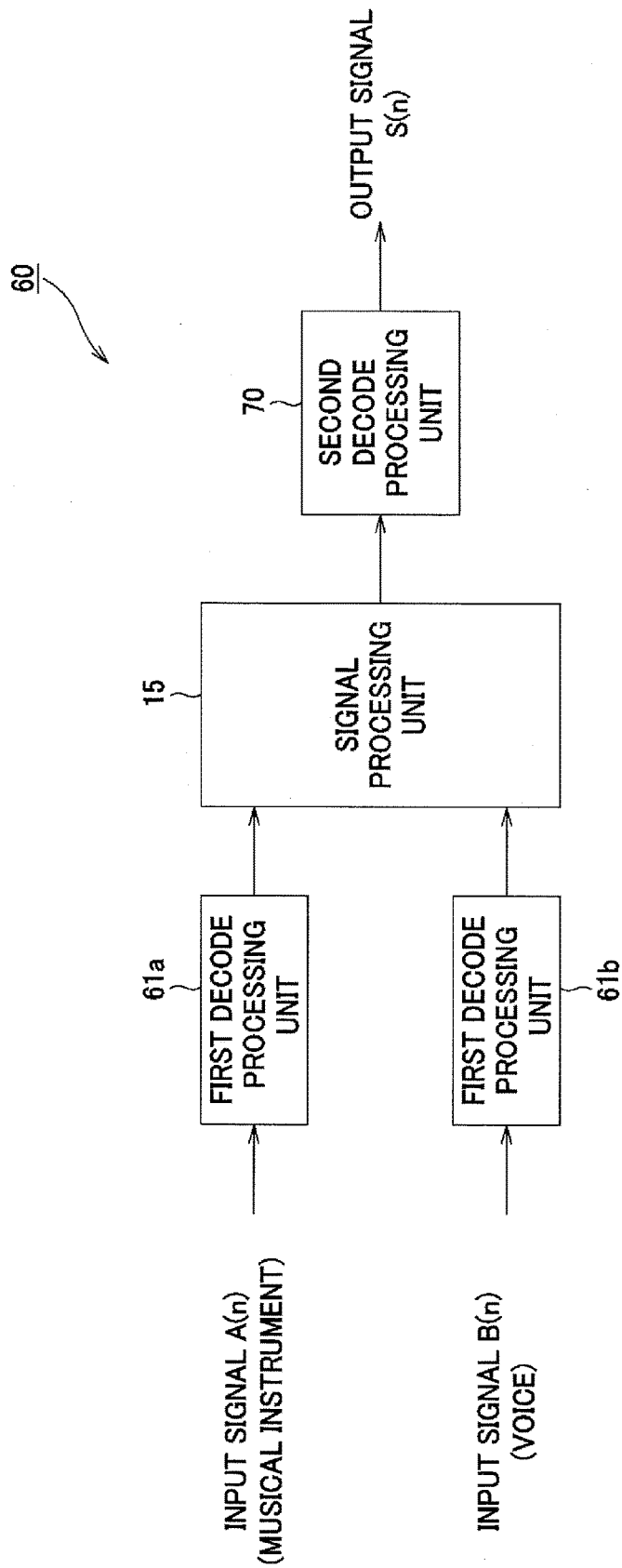
FIG. 14 is a block diagram showing another structural example of the mixing device of one or more embodiments of the present invention different from that of FIG. 1.

As shown in FIG. 14, in place of time-frequency conversion units 11a and 11b shown in FIG. 1 or the like, a mixing device 60 is provided with first decode processing units 61a and 61b for generating data on the time-frequency plane from an MP3 bit stream, a signal processing unit 15 for carrying out a mixing process on data on the time-frequency plane, and a second decode processing unit 70 for converting the generated mixing signal into an output signal S(n) in the time domain. In this case, the first decode processing units 61a and 61b correspond to one mode of the signal data generation unit of one or more embodiments of the present invention. Moreover, the second decode processing unit 70 corresponds to one mode of the output signal generation unit of one or more embodiments of the present invention.

Figure 15:
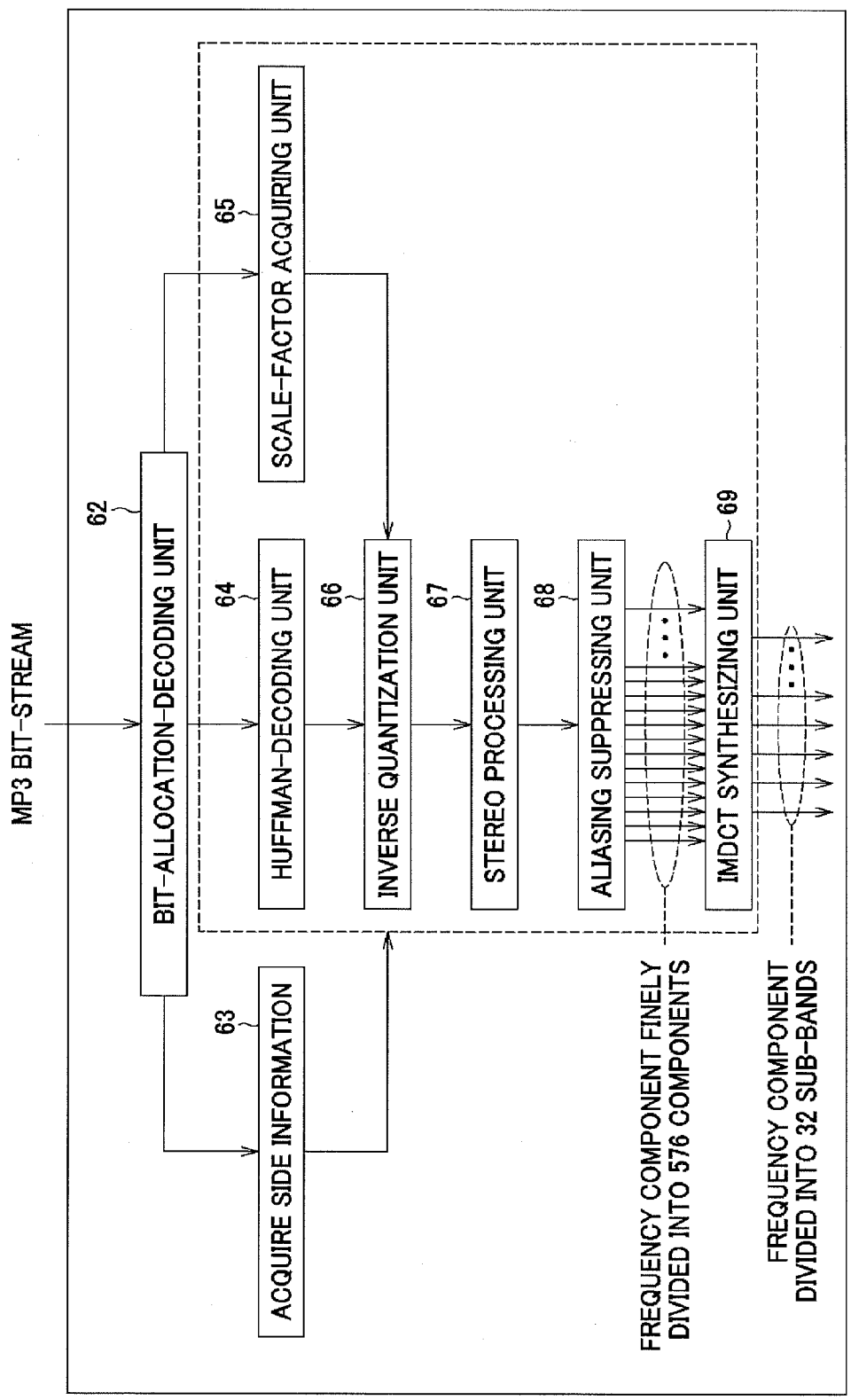
FIG. 15 is a block diagram that relates to the mixing device of one or more embodiments of the present invention having the structure of FIG. 14, and shows a structural example of a signal data generation unit that uses an input signal of an MP3 system, that is, a first decoding process unit, in which by carrying out at least one portion of a decoding process, an input signal is converted to a signal in a frequency domain so as to generate signal data on a time-frequency plane.

As shown in FIG. 15, each of the first decode processing units 61a and 61b is an MP3 decoder provided with a bit-allocation-decoding unit 62, a side information acquiring unit 63, a Huffman-decoding unit 64, a scale-factor acquiring unit 65, an inverse quantization unit 66, a stereo processing unit 67 and an aliasing suppressing unit 68. The processing contents of the respective processing units are the same as those installed in a known MP3 decoder; therefore, the detailed descriptions thereof will be omitted, but the outline thereof will be schematically described below.

First, each of the first decode processing units 61a and 61b extracts a header of a bit stream of an input signal of an MP3 format inputted thereto, and carries out an analysis thereon. More specifically, after the bit-allocation-decoding unit 62 has decoded bit-allocation information, the side information acquiring unit 63 decodes side information, the Huffman-decoding unit 64 decodes Huffman encode data, and the scale-factor acquiring unit 65 decodes scale factors, and these units then extract the resulting data. Next, based upon the side information and scale factor, the inverse quantization unit 66 carries out an inverse quantizing process on the Huffman encode data. Moreover, the stereo processing unit 67 restores the stereo signal, and the aliasing suppressing unit 68 carries out an aliasing suppressing process by executing a butterfly operation. In this manner, by carrying out at least one portion of the decoding process on the input signal of the MP3 format, frequency components of the input signal finely-divided into 576 components can be obtained. Moreover, the first decode processing units 61a and 61b carry out the above-mentioned sequence of processes at a plurality of points of time on the time-axis so that signal data on the time-frequency plane can be generated.

As described above, since the signal data on the time-frequency plane are generated by using one portion of the known MP3 decoder in the first decode processing units 61a and 61b, a mixing process can be carried out by inputting the signal data on the time-frequency plane thus generated to the signal processing unit 15. By using the first decode processing units 61a and 61b based upon one portion of the MP3 decoder, it is possible to greatly reduce the amount of calculations required for the conversion in comparison with a system in which, after the MP3 signal has been once decoded into a signal in the time domain by using the entire MP3 decoder, the time-frequency plane data are further generated by using an FFT or the like.

The second decode processing unit 70 carries out an inverse modified discrete cosine transform (IMDCT) operation on the mixed output from the signal processing unit 15 so that frequency components divided into 32 sub-bands are obtained, and by further synthesizing the sub-bands by using a polyphase filter band (PFB) or the like, it becomes possible to generate an output signal S(n) in the time-domain.

In this modified example, an IMDCT synthesizing unit 69, which carries out an inverse modified discrete cosine transform operation by using the processing results by the aliasing suppressing unit 68 as an input, is further installed in the first decode processing units 61a and 61b so that signal data having frequency components divided into 32 sub-bands may be obtained. In this case, it is only necessary for the second decode processing unit 70 to carry out a sub-band synthesizing process on the mixed output.

Moreover, as the input signal, a voice streaming signal, such as a VoIP (Voice over Internet Protocol) signal, formed by compression-encoding a voice signal and converted into packets, may be used.

In one or more of the above-mentioned embodiment, the frequency-time conversion unit 25 and the second decode processing unit 70 serving as the output signal generation units accept the operation results of the signal processing unit 15 as the input thereof, and convert it into a signal in the time-domain so as to output the output signal; however, by installing the encoding process in the output signal generation unit, an output signal encoded in the time-domain and the frequency-domain may be generated. For example, in the example using an input signal of the above-mentioned MP3 format, the output signal generation unit is allowed to carry out an encoding process of the MP3 format to which a psychological acoustic model signal is further added onto the mixed output so that an output signal of the MP3 format can be generated. In this case, since the mixed output serving as a signal in the frequency-domain can be utilized as an input to be added in mid-stage of the encoding process, it is possible to omit the conversion process into the frequency domain originally included in the encoding process, and consequently to reduce the amount of calculations. Additionally, the signal of the psychological acoustic model may be generated from the mixed output, or may be generated from a signal formed by converting the mixed output into the signal in the time-domain. Alternatively, a signal generated in the mid-stage in the signal generation unit, or the resulting signal after having been further subjected to a signal treatment may be used as the signal of the psychological acoustic model (see de Smet, P, "Subband based MPEG audio mixing for Internet streaming application", Proceedings. ICASSP' 01, 2001 IEEE International Conference Volume: 3 1393-1396, in particular, see FIG. 4).

In one or more of the above-mentioned respective embodiments, all the plural input signals are not necessarily required to have the same signal expression. That is, as the signal data generation unit, by combinedly using the time-frequency conversion unit and the first decode processing unit on demand, for example, such an arrangement as to prepare one of the input signals as a signal in the time-domain, with the other signal serving as a compression-encoded signal, may be formed.

Moreover, with respect to the input/output units of the signal processing unit 15, by combining the time-frequency conversion unit and the first decode processing unit serving as the signal data generation unit on the input side, the frequency-time conversion unit and the second decode processing unit serving as the output signal generation unit on the output side, and a processing unit for carrying out an encoding process on demand, the input signal and the output signal may be allowed to have different signal expressions. For example, from an input signal in the time-domain, an output signal encoded in the time domain and the frequency domain may be obtained, or from an input signal encoded in the time domain and the frequency domain, an output signal in the time-domain may be obtained. Furthermore, a technique by which a coefficient obtained by an operation in a certain encoding-decoding system is converted into a coefficient of another encoding-decoding system is desirably installed in at least one portion of the signal data generation unit, the signal processing unit and the output signal generation unit on demand so that an output signal of an encoding-decoding system different from that of the input signal may be obtained. With respect to this conversion technique, for example, a mutual conversion technique among an MDCT coefficient derived from a modified discrete cosine transform operation, a DFT coefficient derived from the discrete Fourier transformation (DFT) and an FFT coefficient derived from the fast Fourier transform (FFT) may be used (see Y. W. Wang, "On the relationship between MDCT, SDPT and DFT", Processing of WCCC-ICSP 2000, vol. 1, 44-47, etc.) Thus, for example, an input signal may be formed by a signal encoded by the FFT method, while an output signal may be formed by a signal encoded by the MDCT method.

Furthermore, by installing a process for generating a plurality of kinds of output signals in the output signal generation unit, a plurality of kinds of input signals may be generated from one mixed output. For example, an output signal in the time domain and an output signal encoded in the time domain and the frequency domain can be generated.

Although the disclosure has been described with respect to only a limited number of embodiments, those skilled in the art, having benefit of this disclosure, will appreciate that other embodiments can be devised which do not depart from the scope of the present disclosure. Accordingly, the scope of the present disclosure should be limited only by the attached claims.

REFERENCE SIGNS LIST 10, 40, 60 . . . mixing device, 11$a$, 11$b$ . . . time-frequency conversion unit (signal data generation unit), 15 . . . signal processing unit, 16$a$, 16$b$ . . . coefficient unit, 17$a$, 17$b$ . . . amplitude/phase operation unit, 18, 18$a$, 18$b$ . . . adder, 19, 19$a$, 19$b$ . . . complex number operation unit, 20, 20$a$, 20$b$ . . . priority operation control unit, 21, 21$a$, 21$b$ . . . sound presence judgment unit (signal characteristic judgment unit), 22 . . . adder, 23 . . . adder-subtracter, 24 . . . coefficient unit, 25 . . . frequency-time conversion unit (output signal generation unit), 26 . . . adder-subtracter, 27 . . . phase adjustment amount storage unit, 28 . . . limiter, 29, 20 . . . adder, 31$a$ . . . amplitude adjusting unit, 31$b$ . . . phase adjusting unit, 32 . . . multiplier, 33 . . . adder, 34 . . . peak judgment unit (signal characteristic judgment unit), 35 . . . priority operation judgment unit, 36 . . . signal generator, 37 . . . adder, 38 . . . coefficient unit, 40 . . . mixing device, 41$a$, 41$b$ . . . time-frequency conversion unit (signal data generation unit), 42 . . . first BPF, 43 . . . second BPF, 44 . . . third BPF, 45 . . . signal processing unit, 46$a$, 46$b$ . . . coefficient unit, 47 . . . first smart mixer element, 48 . . . second smart mixer element, 49 . . . third smart mixer element, 50 . . . frequency-time conversion unit (output signal generation unit), 51$a$, 51$b$ . . . signal input unit, 52$a$, 52$b$ . . . amplitude operation unit, 53$a$, 53$b$ . . . energy operation unit, 54 . . . priority operation unit, 55$a$, 55$b$ . . . variable coefficient unit, 56 . . . adder, 57 . . . signal output unit, 61$a$, 61$b$ . . . first decode processing unit (signal date generation unit), 62 . . . bit allocation decoding unit, 63 . . . side information acquiring unit, 64 . . . Huffman decoding unit, 65 . . . scale factor acquiring unit, 66 . . . inverse quantization unit, 67 . . . stereo processing unit, 68 . . . aliasing suppressing unit, 69 . . . IMDCT synthesizing unit, 70 . . . second decode processing unit (output signal generation unit)

The invention claimed is:

1. An audio mixing device comprising:
an audio signal data generation circuit that generates signal data on a time-frequency plane composed of a time-axis and a frequency-axis from each of two or more input signals derived from a time domain, wherein at least one of the two or more input signals is a priority signal that has priority to the other signals in order to increase a degree of clearness for the priority signal, with the rest of the input signals being non-priority signals;
an audio signal processing circuit that receives the signal data for the two or more input signals, and performs a mixing process that includes an adding operation of the signal data for each corresponding point on the time-frequency plane of the signal data for each of the input signals, wherein the mixing process carried out by the audio signal processing circuit includes a priority operation that, at the corresponding point, increases an amplitude of the priority signal and reduces an amplitude of the non-priority signal, delays or accelerates at least one of a phase of the non-priority signal and a phase of the priority signal in a direction that makes the phase of the non-priority signal and the phase of the priority signal closer to each other; and
an audio output signal generation circuit that receives a result of the adding operation from the audio signal processing circuit, generates an output signal formed by converting the inputted signal into a signal of a predetermined format, and outputs the output signal to a speaker, amplifier, or storage medium.

2. The audio mixing device according to claim 1, further comprising:
a storage unit for storing signal data of a plurality of points on the time-frequency plane with respect to at least one of the input signals,
wherein the audio signal processing circuit carries out the mixing process on the signal data of the at least one of the input signals by using the signal data of the plural points on the time-frequency plane stored in the storage unit.

3. The audio mixing device according to claim 1, wherein at least one of the input signals is a signal in a time domain, and wherein the audio signal data generation circuit further comprises a time-frequency conversion circuit which, with respect to the input signal in the time domain, converts the input signal into a signal in a frequency domain so as to generate signal data on the time-frequency plane.

4. The audio mixing device according to claim 1, wherein at least one of the input signals is an encoded signal in a time domain and a frequency domain, and wherein the audio signal data generation circuit further comprises a decode processing circuit which, with respect to the encoded input signal, carries out at least one portion of a decoding process on the input signal so as to convert the input signal to a signal in the frequency domain so that signal data on the time-frequency plane is generated.

5. The audio mixing device according to claim 1, wherein the audio output signal generation circuit carries out a conversion to generate a signal in a time domain so as to output the resulting output signal.

6. The audio mixing device according to claim 1, wherein the audio output signal generation circuit generates an encoded output signal in a time domain and a frequency domain.

7. The audio mixing device according to claim 1, wherein the audio signal processing circuit comprises a signal characteristic judgment circuit that:
uses at least signal data of a point that is different from the corresponding point of at least one of the input signals,
has a predetermined relationship with the corresponding point on the time-frequency plane, and
determines a signal characteristic at the corresponding point of the signal data of the at least one of the signals, wherein the adding operation is carried out in accordance with the determined signal characteristic.

8. The audio mixing device according to claim 7, wherein the signal characteristic judgment circuit carries out the determining the signal characteristic.

9. The audio mixing device according to claim 8,
wherein in accordance with the signal characteristic determined by the signal characteristic judgment circuit, the audio signal processing circuit further determines whether or not the priority operation is carried out and/or the degree of the priority operation for each of the corresponding points so as to increase the degree of clearness of the priority signal.

10. The audio mixing device according to claim 9,
wherein the signal characteristic judgment circuit uses at least signal data of a point that is different from the corresponding point of at least one of the input signal and has a predetermined relationship with the corresponding point on the time-frequency plane,
wherein the point having the predetermined relationship is located in a neighborhood region to the corresponding point on the time-frequency plane of signal data of the at least one of the signals,
wherein the neighborhood region is a domain having a predetermined range and a predetermined shape including the corresponding point or a domain composed of points corresponding to multiple sound components of a sound at the corresponding point, and
wherein when energy of signal data at the corresponding point of the at least one of signals generated based on an amplitude of signal data at a point within the neighborhood region of the signal data at the corresponding point of the at least one of signals is greater than a predetermined threshold value, the signal characteristic judgment circuit determines that sound is present at the corresponding point of the at least one of signals.

11. The audio mixing device according to claim 9, further comprising:
an adjustment amount limiting circuit including a function and/or an operation that compares mutual amplitude adjustment amounts, mutual phase adjustment amounts or mutual delay adjustment amounts between the corresponding point and a point adjacent to the corresponding point on the time-frequency plane, and limits or alleviates at least one of the amplitude adjustment amount, the phase adjustment amount or the delay adjustment amount at the corresponding point.

12. The audio mixing device according to claim 9, further comprising:
a signal source for use in adding signal data of a signal generated based upon a signal independent from the priority signal and the non-priority signal or based upon at least one of the signals to the adjustment amount of signal data that is subjected to the priority operation with respect to at least one signal of the priority signal and the non-priority signal.

13. The audio mixing device according to claim 9, wherein the point having the predetermined relationship is a point adjacent to the corresponding point on the time-frequency plane, and
wherein the signal characteristic judgment circuit compares an amplitude of signal data at the corresponding point of the priority signal with an amplitude of signal data at a point adjacent to the corresponding point of the priority signal, and, in the case when the amplitude of the signal data at the corresponding point of the priority signal is larger than the amplitude of the signal data at all at the adjacent points, the signal characteristic judgment circuit determines that the corresponding point of the priority signal is a peak; or
the signal characteristic judgment circuit compares a phase of signal data at the corresponding point of the priority signal with a phase of signal data at a point adjacent to the corresponding point of the priority signal, and, in the case when the energy of signal data at the corresponding point of the priority signal is detected as a peak based upon a relationship between the phase of the signal data at the corresponding point of the priority signal and the phase of the signal data at the adjacent point, the signal characteristic judgment circuit determines that the corresponding point of the priority signal is a peak; or
the signal characteristic judgment circuit compares an amplitude of signal data at the corresponding point of the priority signal with an amplitude of signal data at a point adjacent to the corresponding point of the priority signal and compares a phase of signal data at the corresponding point of the priority signal with a phase of signal data at a point adjacent to the corresponding point of the priority signal, and, in the case when the amplitude of the signal data at the corresponding point of the priority signal is larger than the amplitude of signal data at all the adjacent points, and in the case when the energy of signal data at the corresponding point of the priority signal is detected as a peak based upon a relationship between the phase of the signal data at the corresponding point of the priority signal and the phase of the signal data at the adjacent point, the signal characteristic judgment circuit determines that the corresponding point of the priority signal is a peak.

14. An audio mixing signal processing device comprising:
an audio signal data input circuit that receives an input of signal data on a time-frequency plane composed of a time-axis and a frequency-axis, wherein the signal data is generated from two or more input signals derived from signals in a time domain, wherein at least one of the two or more input signals is a priority signal that has priority to the other signals in order to increase a degree of clearness for the priority signal, with the rest of the input signals being non-priority signals;
an audio signal processing circuit that uses the signal data of the two or more input signals as an input, and carries out a mixing process including an addition of the signal data for each of corresponding points on the time-frequency plane of the respective signal data of the input signals, wherein the mixing process carried out by the audio signal processing circuit includes a priority operation that, at the corresponding point, increases an amplitude of the priority signal and reduces an amplitude of the non-priority signal, delays or accelerates at least one of a phase of the non-priority signal and a phase of the priority signal in a direction that makes the phase of the non-priority signal and the phase of the priority signal closer to each other; and an audio signal data output circuit that outputs an output signal in a predetermined format, to a speaker, amplifier, or storage medium, the output signal being a result of an adding operation from the signal processing.

15. The audio mixing signal processing device according to claim 14, wherein the audio signal processing circuit comprises a signal characteristic judgment circuit that:
uses at least signal data of a point that is different from the corresponding point of at least one of the input signals,
has a predetermined relationship with the corresponding point on the time-frequency plane, and
determines a signal characteristic at the corresponding point of the signal data of the at least one of the signals, wherein the adding operation is carried out in accordance with the determined signal characteristic.

16. A non-transitory recording medium storing an audio mixing program, the program causing a computer to perform:
generating signal data on a time-frequency plane composed of a time-axis and a frequency-axis from respective two or more input signals derived from signals in a time domain, wherein at least one of the two or more input signals is a priority signal that has priority to the other signals in order to increase a degree of clearness for the priority signal, with the rest of the input signals being non-priority signals;
using signal data derived from the two or more input signals as an input signal;
carrying out an audio mixing process including an adding operation of signal data for respective corresponding points on the time-frequency plane of the respective signal data of the input signals, wherein the audio mixing process includes a priority operation that, at the corresponding point, increases an amplitude of the priority signal and reduces an amplitude of the non-priority signal, delays or accelerates at least one of a phase of the non-priority signal and a phase of the priority signal in a direction that makes the phase of the non-priority signal and the phase of the priority signal closer to each other; and
after inputting a result of the audio mixing process, converting the input signal into a signal having a predetermined format, and then outputting a converted signal to a speaker, amplifier, or a storage medium.

17. The non-transitory recording medium according to claim 16, wherein the audio mixing program causes the computer to further perform:
using at least signal data of a point that is different from the corresponding point of at least one of the input signal and having a predetermined relationship with the corresponding point on the time-frequency plane to determine a signal characteristic at the corresponding point of the signal data of the at least one of the signals; and
carrying out the adding operation in accordance with the signal characteristic determined.

18. An audio mixing method comprising:
generating signal data on a time-frequency plane composed of a time-axis and a frequency-axis from respective two or more input signals derived from signals in a time domain, wherein at least one of the two or more input signals is a priority signal that has priority to the other signals in order to increase a degree of clearness for the priority signal, with the rest of the input signals being non-priority signals;
using signal data derived from the two or more input signals as an input signal;
carrying out an audio mixing process including an adding operation of signal data on respective corresponding points on the time-frequency plane of the respective signal data of the input signals, wherein the audio mixing process includes a priority operation that, at the corresponding point, increases an amplitude of the priority signal and reduces an amplitude of the non-priority signal, delays or accelerates at least one of a phase of the non-priority signal and a phase of the priority signal in a direction that makes the phase of the non-priority signal and the phase of the priority signal closer to each other;
converting the input signal into a signal having a predetermined format in the time domain; and
outputting a converted signal in a predetermined format to a speaker, amplifier, or storage medium.

19. The audio mixing method according to claim 18, further comprising:
using at least signal data of a point that is different from the corresponding point of at least one of the input signal and having a predetermined relationship with the corresponding point on the time-frequency plane to determine a signal characteristic at the corresponding point of the signal data of the at least one of the signals; and
carrying out the adding operation in accordance with the signal characteristic determined.

* * * * *